United States Patent
Demers

(10) Patent No.: US 11,084,607 B2
(45) Date of Patent: Aug. 10, 2021

(54) PROCESS AND APPARATUS FOR CONTINUOUSLY ENCAPSULATING ELONGATED COMPONENTS AND ENCAPSULATED ELONGATED COMPONENTS OBTAINED

(71) Applicant: adidas AG, Herzongenaurach (DE)

(72) Inventor: Gaétan Demers, Quebec (CA)

(73) Assignee: adidas AG, Herzogenauarch (DE)

( * ) Notice: Subject to any disclaimer, the term of this patent is extended or adjusted under 35 U.S.C. 154(b) by 212 days.

(21) Appl. No.: 16/241,597

(22) Filed: Jan. 7, 2019

(65) Prior Publication Data

US 2019/0135464 A1    May 9, 2019

Related U.S. Application Data

(62) Division of application No. 14/112,853, filed as application No. PCT/CA2012/050244 on Apr. 18, 2012, now Pat. No. 10,189,587.

(Continued)

(51) Int. Cl.

| | |
|---|---|
| *B65B 9/06* | (2012.01) |
| *B32B 38/18* | (2006.01) |
| *D03D 1/00* | (2006.01) |
| *H05K 1/03* | (2006.01) |
| *B32B 5/02* | (2006.01) |

(Continued)

(52) U.S. Cl.
CPC .............. *B65B 9/06* (2013.01); *B32B 3/08* (2013.01); *B32B 3/085* (2013.01); *B32B 5/022* (2013.01); *B32B 5/024* (2013.01); *B32B 7/12* (2013.01); *B32B 27/12* (2013.01); *B32B 37/20* (2013.01); *B32B 38/1816* (2013.01); *B32B 38/1841* (2013.01); *D03D 1/0088* (2013.01); *H01B 7/0838* (2013.01); *H05K 1/038* (2013.01); *B32B 37/0053* (2013.01); *B32B 37/12* (2013.01); *B32B 2305/34* (2013.01); *B32B 2307/202* (2013.01); *B32B 2437/00* (2013.01); *B65B 15/04* (2013.01)

(58) Field of Classification Search
USPC .......................................... 139/420 R, 425 R
See application file for complete search history.

(56) References Cited

U.S. PATENT DOCUMENTS

| | | | |
|---|---|---|---|
| 3,586,593 A | 6/1971 | Dahl, Jr. | |
| 4,534,886 A * | 8/1985 | Kraus | B29C 70/504 252/502 |

(Continued)

FOREIGN PATENT DOCUMENTS

| | | |
|---|---|---|
| CA | 2448220 A1 | 1/2003 |
| CN | 1582501 | 2/2005 |

(Continued)

OTHER PUBLICATIONS

International Search Report for PCT/CA2012/050244, dated Jun. 27, 2012, 2 pages.

(Continued)

*Primary Examiner* — Lynda Salvatore
(74) *Attorney, Agent, or Firm* — Sterne, Kessler, Goldstein & Fox P.L.L.C.

(57) ABSTRACT

An encapsulated electrotextile includes at least one electrotextile strip and at least one elongated wire. The at least one electrotextile strip and the at least one elongated wire are laminated between two encapsulation films.

23 Claims, 15 Drawing Sheets

Related U.S. Application Data

(60) Provisional application No. 61/476,472, filed on Apr. 18, 2011.

(51) Int. Cl.
  | | | |
  |---|---|---|
  | *B32B 7/12* | (2006.01) | |
  | *B32B 27/12* | (2006.01) | |
  | *B32B 3/08* | (2006.01) | |
  | *B32B 37/20* | (2006.01) | |
  | *H01B 7/08* | (2006.01) | |
  | *B32B 37/00* | (2006.01) | |
  | *B65B 15/04* | (2006.01) | |
  | *B32B 37/12* | (2006.01) | |

(56) References Cited

U.S. PATENT DOCUMENTS

| | | |
|---|---|---|
| 5,388,584 A | 2/1995 | King |
| 5,824,959 A | 10/1998 | Mista et al. |
| 2003/0211797 A1 | 11/2003 | Hill et al. |
| 2005/0067007 A1 | 3/2005 | Toft |
| 2007/0215232 A1* | 9/2007 | Hassonjee ............... B32B 5/26 139/425 R |
| 2011/0026233 A1 | 2/2011 | Hong et al. |
| 2011/0151156 A1* | 6/2011 | Granberg ............... B32B 27/304 428/34.2 |

FOREIGN PATENT DOCUMENTS

| | | |
|---|---|---|
| DE | 102004035649 | 3/2006 |
| JP | H09-198933 A | 7/1997 |
| JP | 11-284293 A | 10/1999 |
| JP | 2000-011770 A | 1/2000 |
| JP | 2001-229739 A | 8/2001 |
| JP | 2002-056733 A | 2/2002 |
| JP | 2007-207629 A | 8/2007 |
| JP | 2007-261471 A | 10/2007 |
| WO | WO 2006/127769 | 11/2006 |
| WO | WO 2010/044018 | 4/2010 |

OTHER PUBLICATIONS

Supplementary Partial European Search Report for EP Appl. No. 12 77 4642, European Patent Office, Munich, Germany, dated Jan. 28, 2015, 6 pages.

Office Action issued in Japanese Patent Application No. 2014-505471, dated Aug. 22, 2016, with English translation, 6 pages.

* cited by examiner

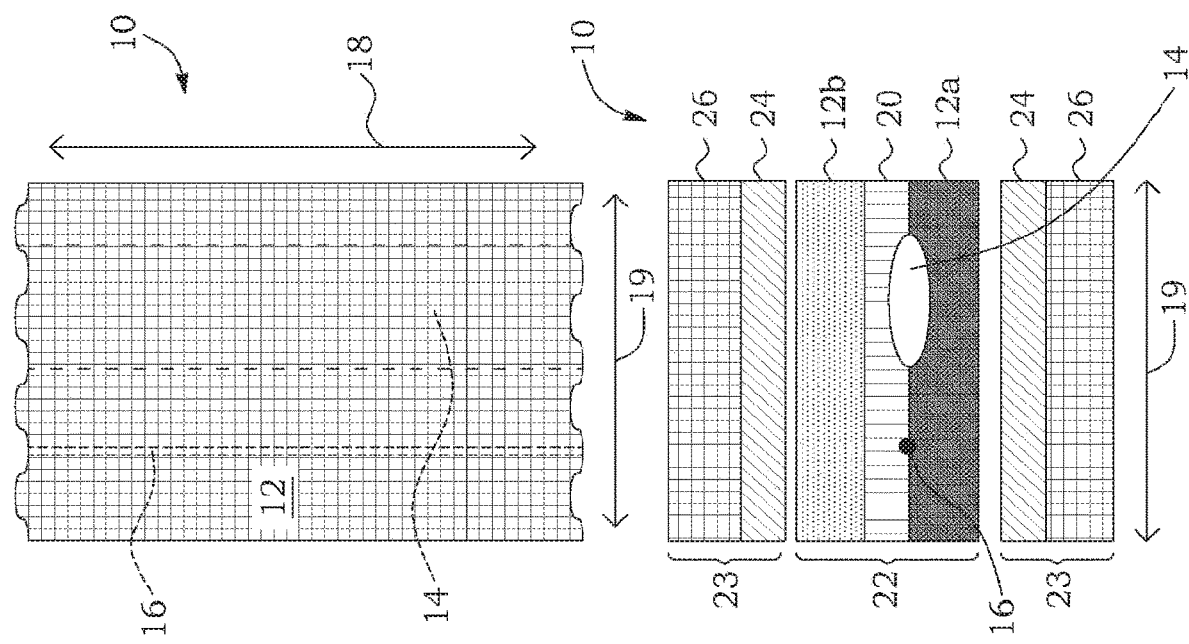

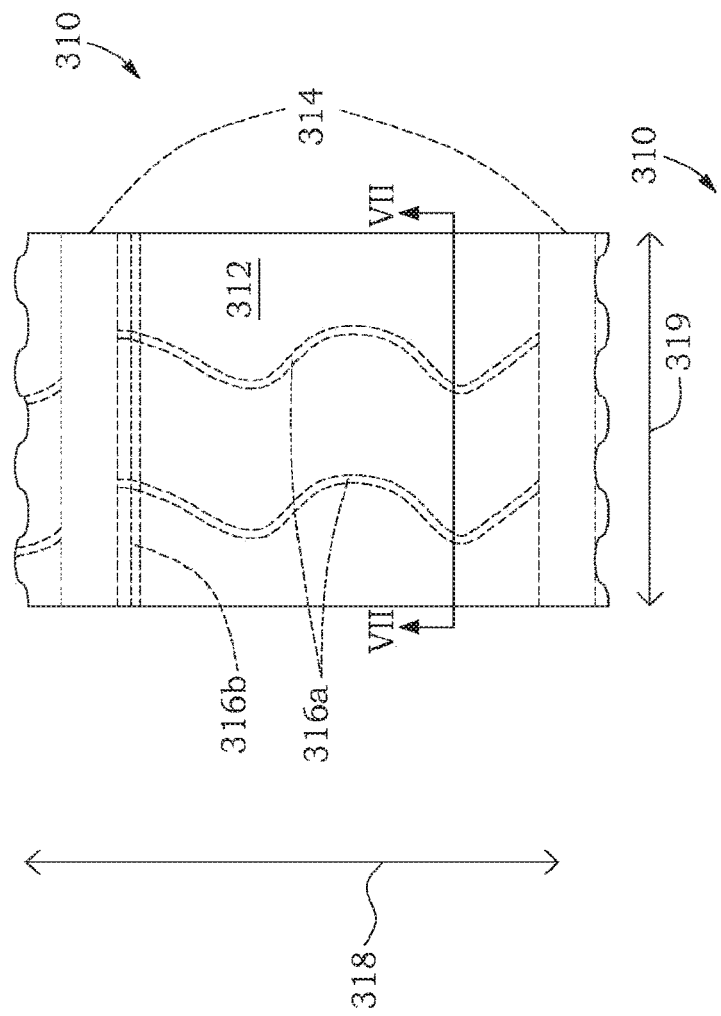
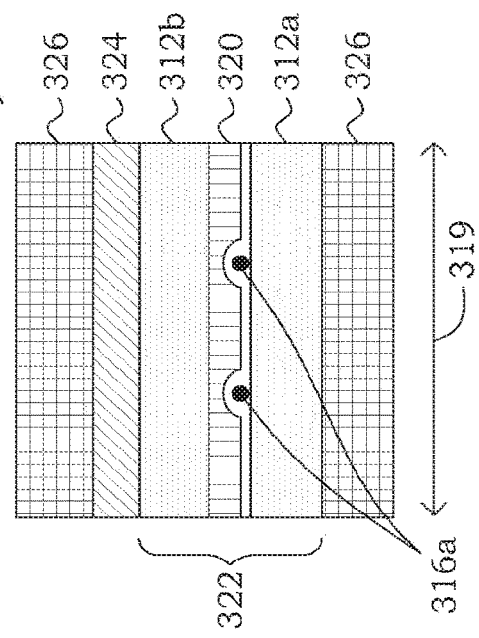

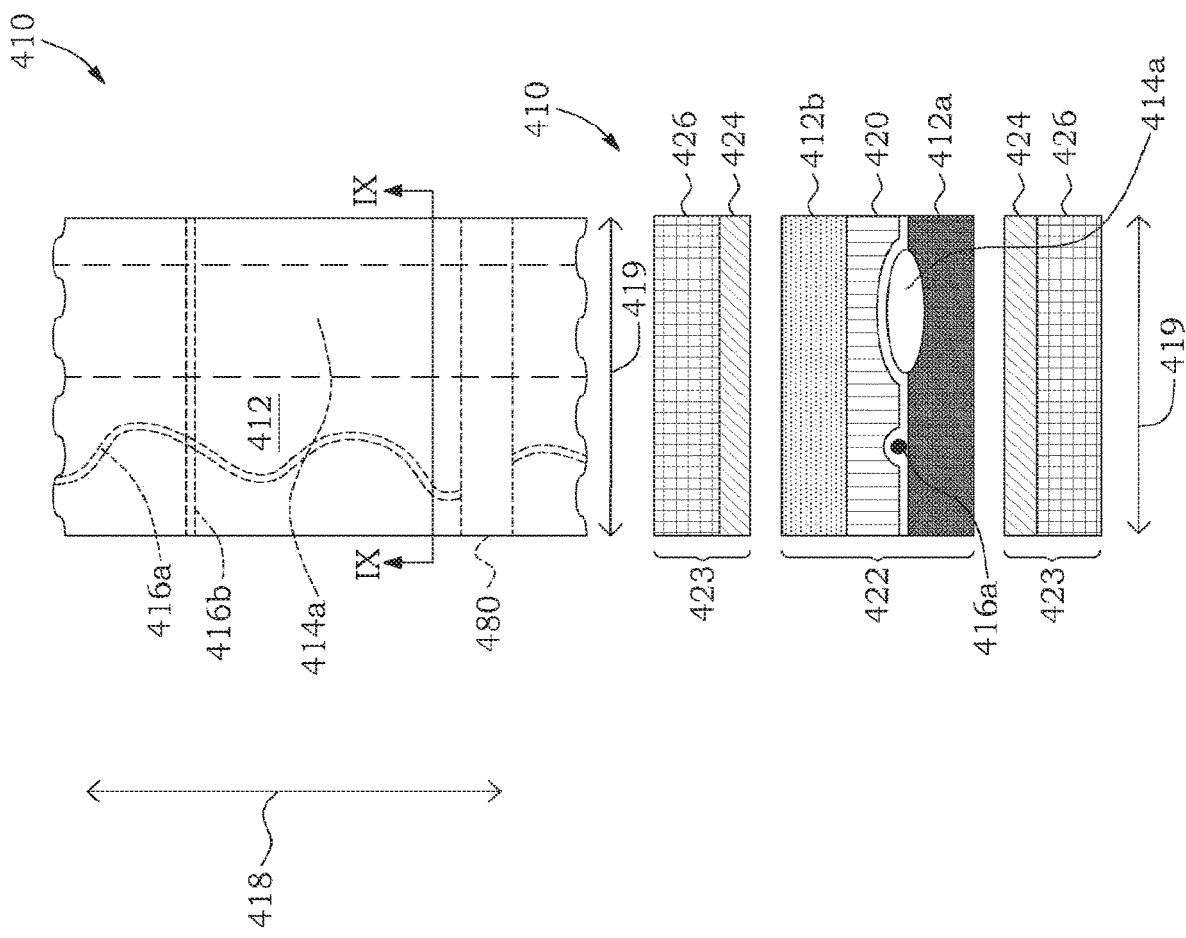

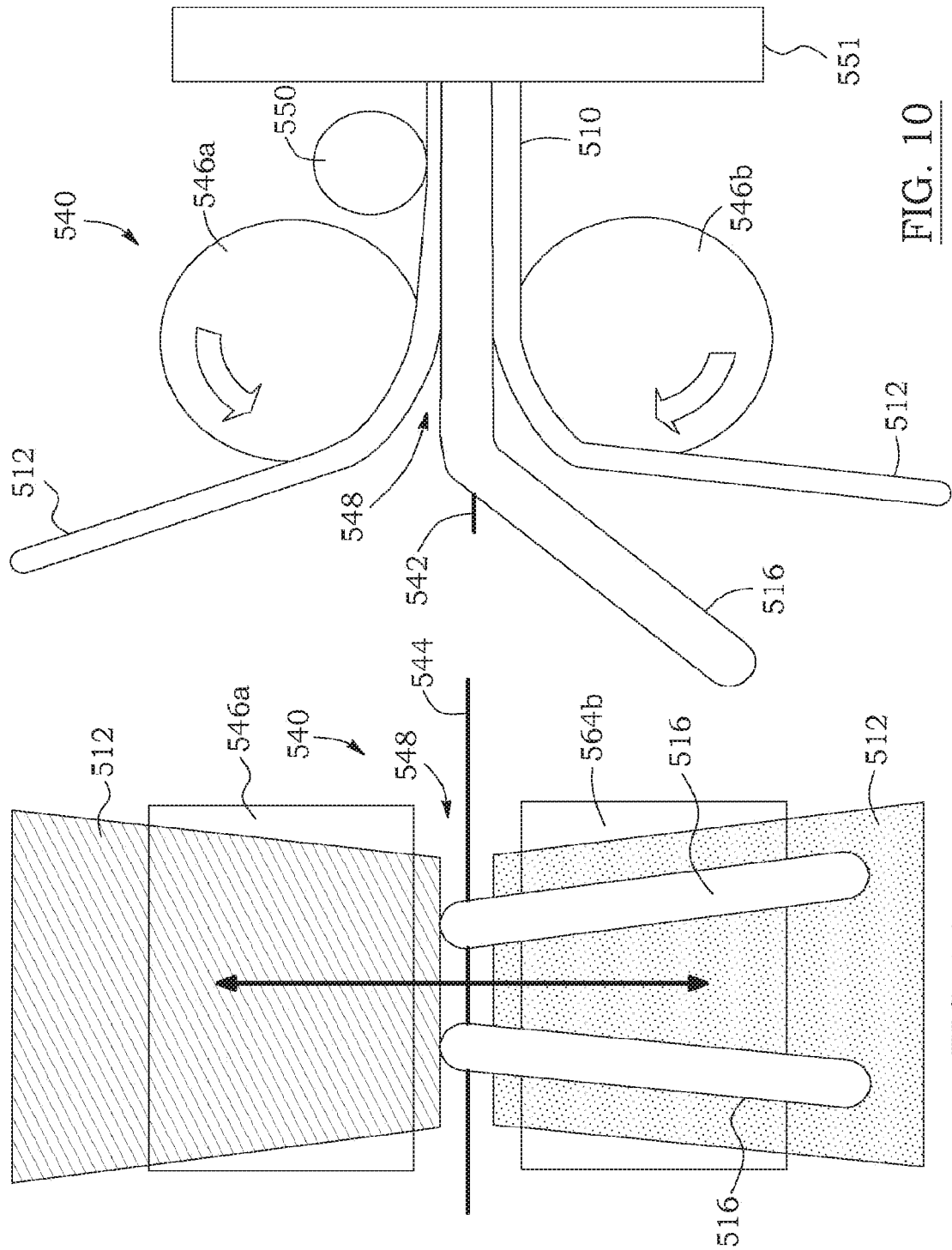

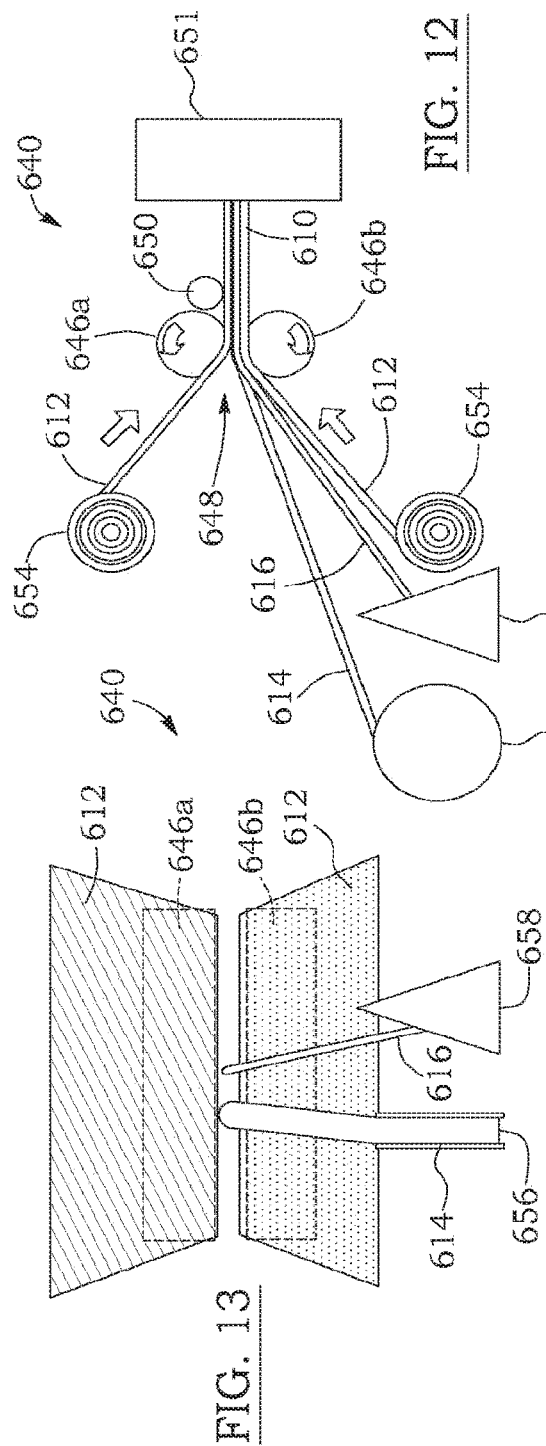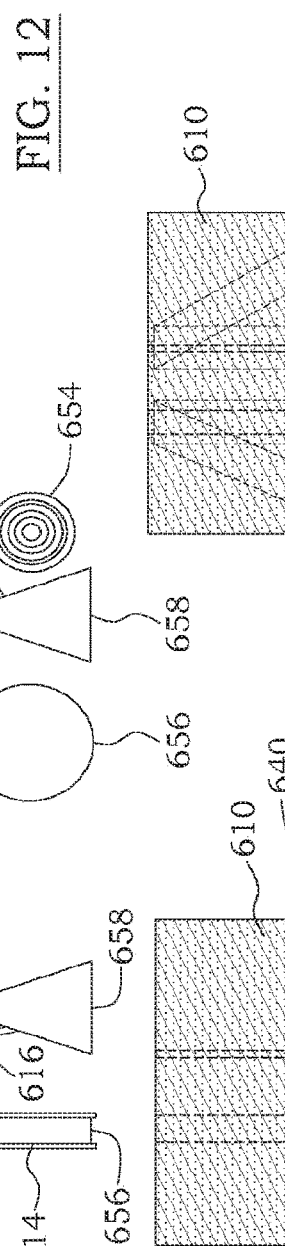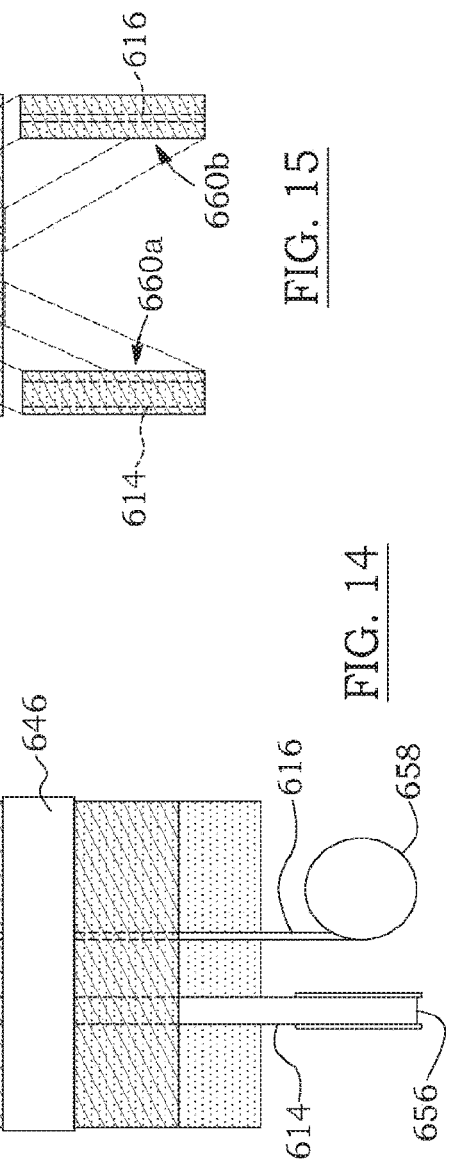
FIG. 12
FIG. 13
FIG. 14
FIG. 15

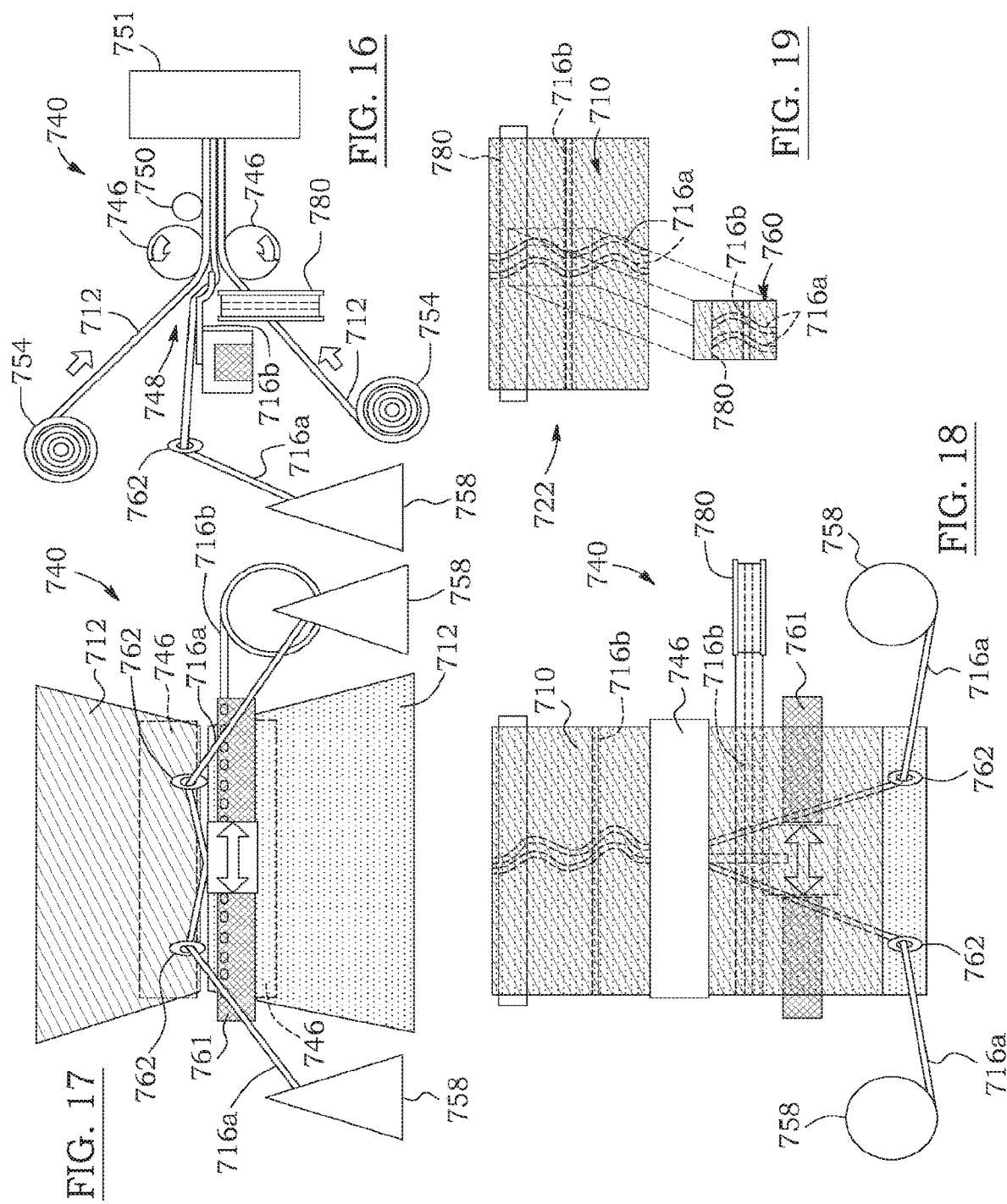

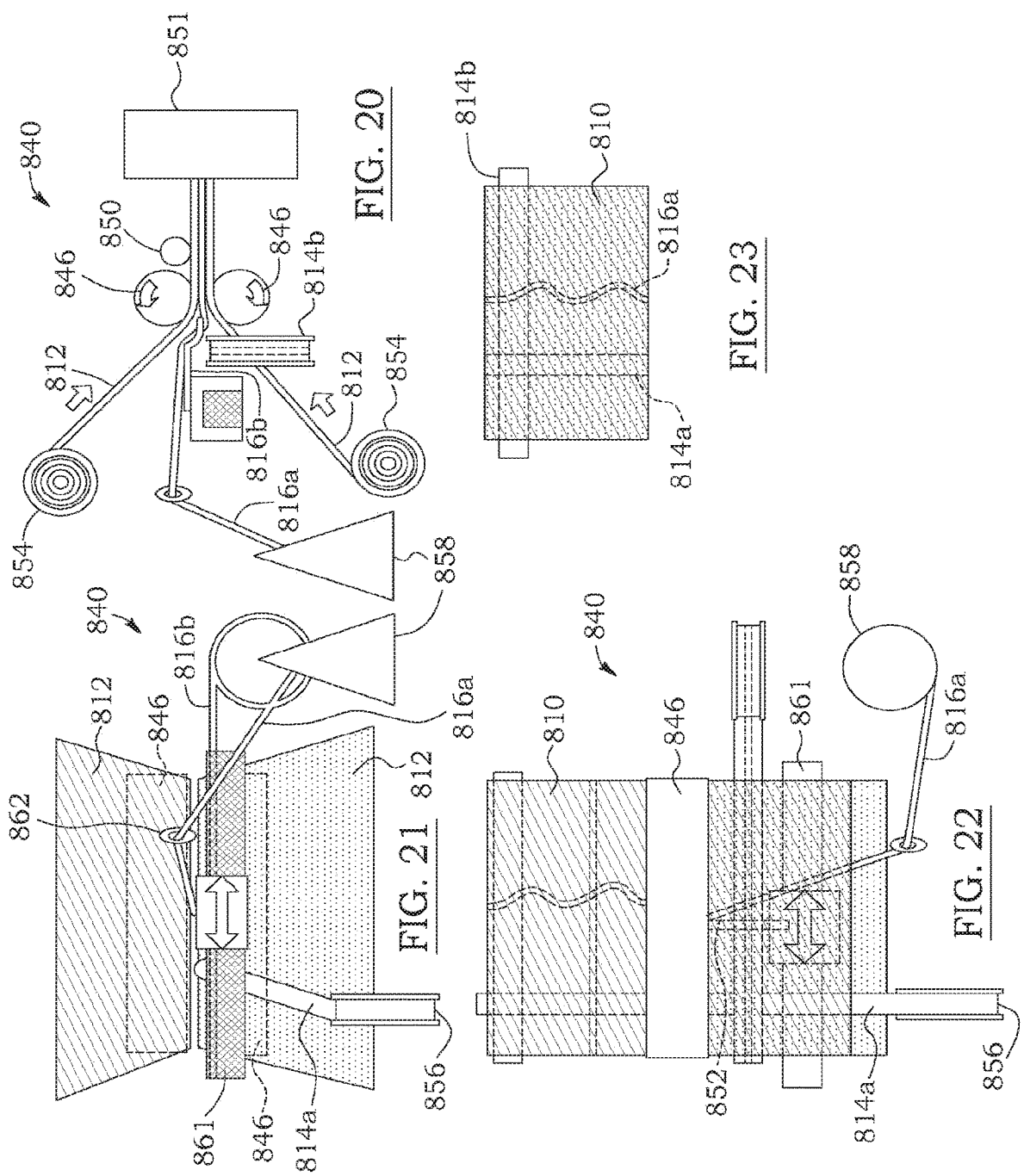

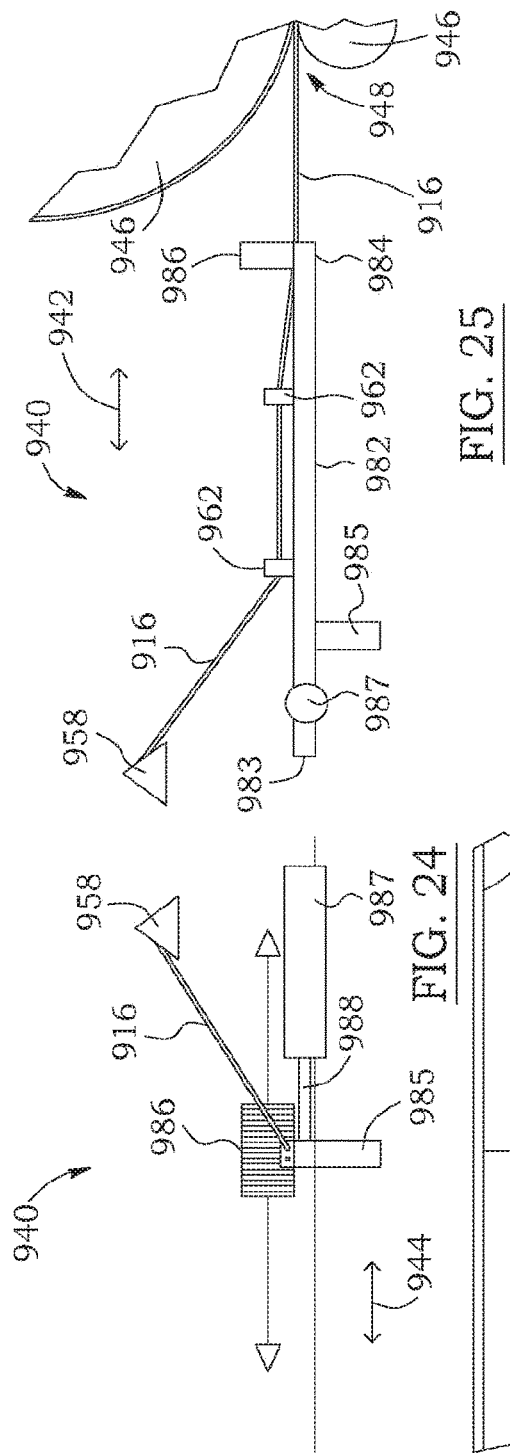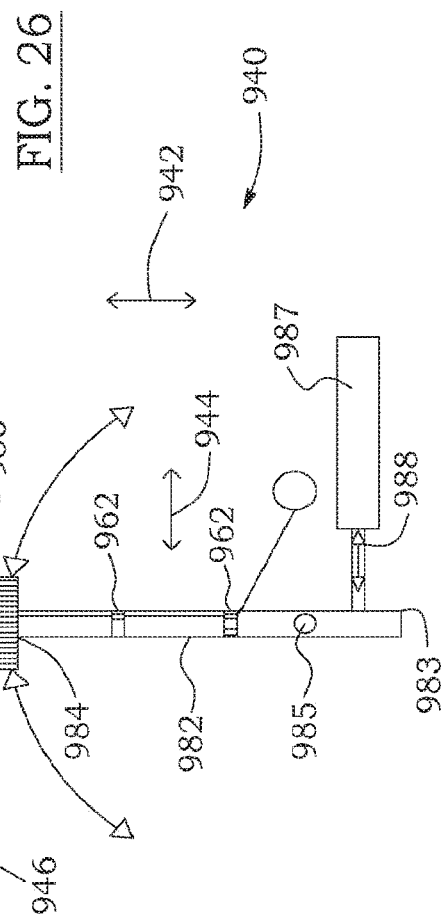

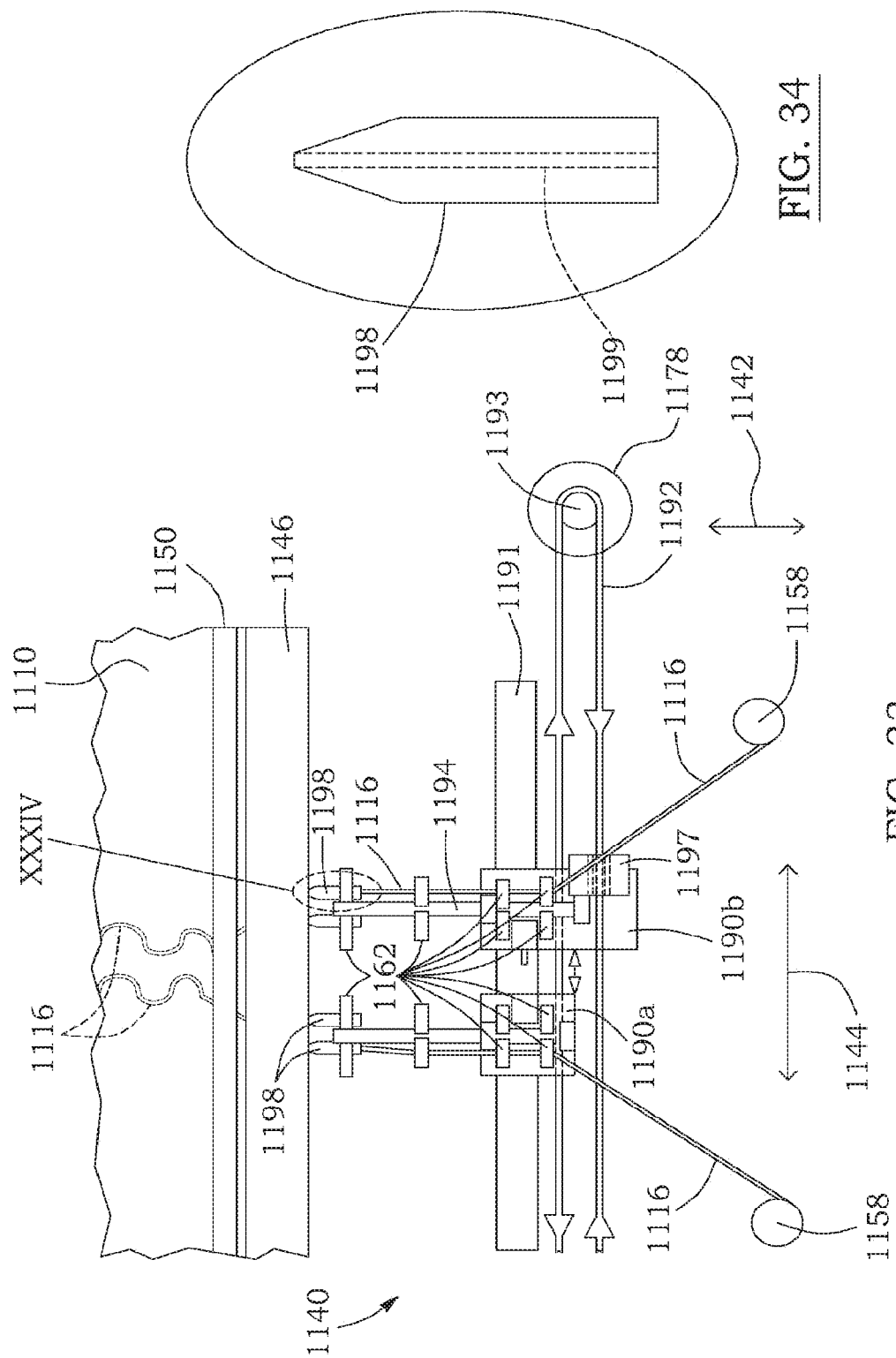

PROCESS AND APPARATUS FOR CONTINUOUSLY ENCAPSULATING ELONGATED COMPONENTS AND ENCAPSULATED ELONGATED COMPONENTS OBTAINED

CROSS-REFERENCE TO RELATED APPLICATIONS

This application is a divisional application of U.S. application Ser. No. 14/112,853, filed Nov. 25, 2013, which is a national phase application of International Application PCT/CA2012/050244, filed Apr. 18, 2012 and published Oct. 26, 2012, which claims the benefit under 35 USC § 119(e) of U.S. Provisional Patent Application 61/476,472, filed on Apr. 18, 2011, the specification of which is hereby incorporated by reference.

TECHNICAL FIELD OF THE INVENTION

The technical field relates to a process and an apparatus for continuously encapsulating elongated components including electrical conductors in a flexible encapsulation pocket and to the encapsulated elongated components obtained. More particularly, it relates to a process and an apparatus for continuously encapsulating electrical conductors in a flexible encapsulation pocket to manufacture electrotextiles with encapsulated electrical conductors.

BACKGROUND

Electrotextiles, also known as E-textiles and electronic textiles, are fabrics with electronic interconnection elements for energy and data transfer within their structure, such as conductive wires or particles. The fabric or textile acts as a support into which the conductive elements are added.

However, adding conductive functionalities to conventional textiles creates challenges. As conventional textiles, electrotextiles must be washable. Thus, accelerated corrosion problems occur to the conductive elements embedded in the textile. There is thus a need to protect the conductive elements, slow down corrosion problems, and increase the lifetime of the electrotextiles while maintaining acceptable production costs and rates.

Furthermore, the elasticity of the textile should be maintained, non-rectilinear or irregular patterns may be needed and the electrical conductors should be accessible.

BRIEF SUMMARY OF THE INVENTION

It is therefore an aim of the present invention to address the above mentioned issues.

According to a general aspect, there is provided a process for a continuous production of an encapsulated component web, the process comprising the steps of: conveying at least two continuous encapsulation films, spaced apart from one another, along a longitudinal axis of a production line; inserting at least one encapsulatable component between the two continuous encapsulation films; conveying an assembly including the two continuous encapsulation films with the at least one encapsulatable component extending therebetween in a nip defined in between at least two contiguous rolls; and laminating the assembly to encapsulate the at least one encapsulatable component between the two continuous encapsulation films.

According to another general aspect, there is provided an apparatus for a continuous production of an encapsulated component web, the apparatus comprising: at least two encapsulation film supports configured for supporting at least two continuous encapsulation film supplies; at least one encapsulatable component feeder inserting at least one encapsulatable component between the two continuous encapsulation films; and at least two contiguous rolls defining a nip in between, the at least two encapsulation film roll supports being mounted upstream of the at least two contiguous rolls and the at least one encapsulatable component feeder along a production line.

According to another general aspect, there is provided a process for a continuous production of an encapsulated component web, the process comprising the steps of: conveying at least two continuous encapsulation films, spaced apart from one another, along a longitudinal axis of a production line; conveying at least one encapsulatable component along the longitudinal axis of the production line between the two continuous encapsulation films; displacing transversally at least one of the at least one encapsulatable component simultaneously while the at least one encapsulatable component is conveyed along the longitudinal axis of the production line; superposing an assembly including the at least two continuous encapsulation films and the at least one encapsulatable component with the at least one encapsulatable component extending between two of the at least two continuous encapsulation films; and laminating the assembly to encapsulate the at least one encapsulatable component between the at least two continuous encapsulation films.

In an embodiment, when superposing the assembly, the assembly is conveyed in a nip defined in between at least two contiguous rolls and the longitudinal axis of the production line is substantially perpendicular to a rotation axis of the two contiguous rolls and pressure is applied on the assembly in the nip.

In an embodiment, when displacing transversally at least one of the at least one encapsulatable component, a guiding member, with which the at least one of the at least one encapsulatable component is engaged, is translated along a transversal axis of the production line. The guiding member can be slidably mounted to an elongated track provided adjacent and upstream of the nip along the production line. The displacements of the guiding member can be controlled.

In an embodiment, when the at least two continuous encapsulation films are conveyed, at least one of the at least two continuous encapsulation films is heated for activating a heat activated adhesive layer provided on an inner face thereof. This can be carried out upstream of the nip.

The laminating step can further comprise activating an adhesive layer extending on an inner face of at least one of the at least two continuous encapsulation films and allowing the adhesive layer to set. The activation of the adhesive layer can include heating the latter. The laminating step can be carried out while the assembly is conveyed through the production line.

The conveying step can comprise conveying at least two elongated encapsulatable components along the production axis and the displacing comprises displacing transversally the at least two elongated encapsulatable components simultaneously while being conveyed along the longitudinal axis of the production line.

The displacing step can further comprise displacing transversally the at least two elongated encapsulatable components simultaneously by a same distance and in a same direction wherein the encapsulated elongated components extend substantially parallel to one another in the encapsulated component web.

The displacing step can further comprise displacing transversally the at least two elongated encapsulatable components simultaneously by a same distance and in an opposite direction wherein the encapsulated elongated components define a symmetric pattern in the encapsulated component web.

The process can further comprise inserting at least one encapsulatable component along a transversal axis, extending substantially perpendicularly to the longitudinal axis of the production line, between the at least two continuous encapsulation films, the at least one encapsulatable component inserted along the transversal axis extending between the at least two continuous encapsulation films in the superposed assembly.

In an embodiment, at least one of the at least two continuous encapsulation films comprises a polymeric film.

In an embodiment, at least one of the at least two continuous encapsulation films comprises an adhesive layer on an inner face thereof. The adhesive layer can be at least one of continuous and discontinuous along the inner face of the at least one of the at least two continuous encapsulation films.

In an embodiment, when the at least two continuous encapsulation films are conveyed, they are also unrolled from at least two roll supplies.

In an embodiment, at least one of the at least one encapsulatable component displaced transversally comprises an elongated wire and/or an electrical conductor. The electrical conductor can comprise at least one of an electrical wire, an electrotextile, and a continuous electrical conductive wire. The electrical conductor can comprise at least one continuous electrotextile strip and the inserting step can further comprise conveying the at least one continuous electrotextile strip in between the at least two continuous encapsulation films and substantially parallel to the longitudinal axis of the production line. The at least one electrotextile strip can comprise a woven textile strip with at least one electrical wire or a non-woven fabric with a plurality of electric conductive particles.

At least one of the at least two continuous encapsulation films can also comprise an adhesive layer on an outer face thereof.

According to another general aspect, there is provided an encapsulated electrical conductor obtained by the process described above, wherein the at least one of the at least one encapsulatable component displaced transversally comprises at least one electrical conductor.

According to another general aspect, there is provided an encapsulated elongated component obtained by the process described above, wherein the at least one of the at least one encapsulatable component displaced transversally comprises at least one elongated encapsulatable component.

According to another general aspect, there is provided a process for a continuous production of an encapsulated component web, the process comprising the steps of: conveying at least two continuous encapsulation films, spaced apart from one another, along a longitudinal axis of a production line; inserting at least one encapsulatable component along a transversal axis extending substantially perpendicularly to the longitudinal axis of the production line, between the at least two continuous encapsulation films; superposing an assembly including the at least two continuous encapsulation films and the at least one encapsulatable component with the at least one encapsulatable component extending between two of the at least two continuous encapsulation films; and laminating the assembly to encapsulate the at least one encapsulatable component between the at least two continuous encapsulation films.

In an embodiment, the superposing step further comprises conveying the assembly in a nip defined in between at least two contiguous rolls and the longitudinal axis of the production line is substantially perpendicular to a rotation axis of the two contiguous rolls and the inserting comprises inserting the at least one encapsulatable component in a guide member extending along the transversal axis and then conveying the at least one encapsulatable component inserted in the guide member along the longitudinal axis towards the nip. Pressure can be applied on the assembly in the nip.

In an embodiment, the insertion of the at least one encapsulatable component in a guide member comprises pushing the at least one encapsulatable component along the transversal axis in the guide member.

In an embodiment, the insertion of the at least one encapsulatable component in a guide member comprises pulling the at least one encapsulatable component along the transversal axis in the guide member. Pulling the at least one encapsulatable component can comprise: clamping the at least one encapsulatable component with a translatable member; translating the translatable member along the transversal axis; and releasing the at least one clamped encapsulatable component in the guide member.

In an embodiment, the at least one encapsulatable component has a predetermined length and a longitudinal axis and the longitudinal axis of the at least one encapsulatable component is substantially parallel to the transversal axis in the superposed assembly.

In an embodiment, the process further comprises conveying at least one encapsulatable component along the longitudinal axis of the production line between the two continuous encapsulation films; and inserting the at least one encapsulatable component between the at least two continuous encapsulation films simultaneously while the at least one encapsulatable component is conveyed along the longitudinal axis of the production line, the at least one encapsulatable component extending between the at least two continuous encapsulation films in the superposed assembly. The at least one of the at least one encapsulatable component can be displaced transversally simultaneously while the at least one encapsulatable component is conveyed along the longitudinal axis of the production line.

In an embodiment, when the at least two continuous encapsulation films are conveyed, at least one of them can also be heated for activating a heat activated adhesive layer provided on an inner face thereof. This can be carried out upstream of the nip.

In an embodiment, the laminating can further comprise activating an adhesive layer extending on an inner face of at least one of the at least two continuous encapsulation films and allowing the adhesive layer to set. The activation can comprise heating the adhesive layer.

The lamination step can be carried out while the assembly is conveyed through the production line.

In an embodiment, at least one encapsulatable component inserted along the transversal axis comprises at least one of an elongated non-conductive wire, an electrical conductive wire, an electrical conductive strip, and a non-conductive material strip.

In an embodiment, at least one encapsulatable component comprises an electrotextile. The electrotextile can comprise at least one of a woven textile strip with at least one electrical wire and a non-woven fabric with a plurality of electric conductive particles.

In an embodiment, at least one encapsulatable component comprises a paper strip. The paper strip can comprise a paper strip coated with at least one of silicon, Teflon®, and wax.

In an embodiment, at least one of the at least two continuous encapsulation films comprises a polymeric film.

In an embodiment, at least one of the at least two continuous encapsulation films comprises an adhesive layer on an inner face thereof. The adhesive layer can be continuous or discontinuous along the inner face of the at least one of the at least two continuous encapsulation films.

According to another general aspect, there is provided an encapsulated electrotextile, comprising at least one electrotextile strip laminated between two encapsulation films. At least one of the two encapsulation films can comprise a polymeric film. The at least one electrotextile strip can comprise a woven textile strip with at least one electrical wire or a non-woven fabric with a plurality of electric conductive particles. At least one of the two encapsulation films can comprise an adhesive layer on an inner face thereof, which can be continuous or discontinuous. At least one of the two encapsulation films can also comprise an adhesive layer on an outer face thereof.

It can further comprise at least one elongated wire laminated between the two encapsulation films, which can extend along a wave-shaped pattern. The elongated wire can be an electrical conductor. It can further comprise at least one paper strip coated with at least one of silicon, Teflon®, and wax laminated between the two encapsulation films.

According to another general aspect, there is provided an encapsulated elongated component, comprising at least one elongated component extending along a wave shaped pattern and laminated between two encapsulation films. At least one of the two encapsulation films can comprise a polymeric film. The at least one elongated component can comprise an elongated electrical conductor. At least one of the two encapsulation films can comprise an adhesive layer on an inner face thereof, which can be continuous or discontinuous. At least one of the two encapsulation films can also comprise an adhesive layer on an outer face thereof.

The elongated wire can be an electrical conductor. It can further comprise at least one paper strip coated with at least one of silicon, Teflon®, and wax laminated between the two encapsulation films.

It can further comprise at least two elongated components extending substantially parallel to one another along the wave shaped pattern. The wave shaped patterns can be substantially symmetric or asymmetric.

According to still another general aspect, there is provided an apparatus for a continuous production of an encapsulated component web. The apparatus comprises: a production line having a longitudinal axis; at least two contiguous rolls defining a nip in between; at least two encapsulation film supports configured for supporting at least two continuous encapsulation film supplies and supplying at least two continuous encapsulation films from the at least two continuous encapsulation film supplies, the at least two encapsulation film supports being mounted upstream of the at least two contiguous rolls along the production line; at least one encapsulatable component feeder configured for supplying and inserting at least one encapsulatable component between the two continuous encapsulation films, the at least one encapsulatable component feeder being mounted upstream of the at least two contiguous rolls along the production line; and at least one translation unit for displacing transversally at least one of the at least one encapsulatable component supplied by the at least one encapsulatable component feeder, the at least one translation unit being mounted upstream of the at least two contiguous rolls and downstream of the at least one encapsulatable component feeder along the production line.

In an embodiment, the at least one translation unit is mounted adjacent to the nip.

In an embodiment, the at least one translation unit comprises at least one elongated track extending along a transversal axis, perpendicular to the longitudinal axis of the production line, and at least one carriage slidably mounted to the elongated track, and having at least one guide member mounted thereto, at least one of the at least one encapsulatable component being engageable with the at least one guide member and translating therewith along the transversal axis. The at least one carriage can comprise at least two carriages and a first one and a second one of the carriages comprise complementary biasing members for attracting the first one and the second one of the carriages towards one another. The at least one carriage can comprise an elongated arm protruding forwardly along the longitudinal axis and having at least one of the at least one guide member mounted to a proximal end thereof, proximal to the nip. The at least one of the at least one guide member mounted to the proximal end of the elongated arm can comprise a nozzle having an internal channel defined therein through which at least one of the at least one encapsulatable component is insertable. The nozzle can be a tapered end nozzle with an outer surface with a radius of curvature that substantially corresponds to a radius of curvature of the at least two contiguous rolls.

Alternatively, the at least one of the at least one guide member mounted to the proximal end of the elongated arm can comprise a needle having a through-hole defined therein through which at least one of the at least one encapsulatable component is insertable.

The at least one translation unit can further comprise at least one belt rotatably mounted around a plurality of pulleys, extending along the transversal axis, and operatively connected to the at least one carriage. The at least one of the pulleys can be a driving pulley which engages in rotation at least one of the at least one belt and in translation at least one of the at least one carriage. The at least one belt can have a first belt section and a second belt section and at least one of the at least one carriage can be connected to the first belt section. The at least one carriage can comprise at least two carriages and the at least one belt can have a first belt section and a second belt section and a first one of the at least two carriages can be connected to the first belt section and a second one of the at least two carriages can be disconnectably connectable to the second belt section.

Alternatively, the at least one translation unit can comprise a pivotable arm having at least one guide member mounted at a proximal end thereof, proximal to the nip, at least one of the at least one encapsulatable component being engageable with the at least one guide member and pivoting therewith about a pivot point distal from the proximal end.

In an embodiment, the apparatus further comprises a controller operatively connected to the at least one translation unit.

In an embodiment, the apparatus further comprises a lamination unit conveying the encapsulated component web along the apparatus. The lamination unit can further comprise a heating unit for heating an adhesive layer extending on at least one of the at least two continuous encapsulation films.

In an embodiment, the apparatus further comprises an adhesive layer heater. The adhesive layer heater can be mounted upstream of the nip and close to a path of at least one of the at least two continuous encapsulation films.

The at least two contiguous rolls can comprise a hard core and a resilient sleeve surrounding the hard core.

The at least two continuous encapsulation films and the at least one encapsulatable component are superposed to one another in the nip to form an assembly.

In an embodiment, the apparatus further comprises a driven roll mounted downstream of the at least two contiguous rolls along the production line and abutting the assembly.

The longitudinal axis of the production line is substantially perpendicular to a rotation axis of the two contiguous rolls.

In an embodiment, the apparatus further comprises at least one transversal insertion unit for inserting at least one of the at least one encapsulatable component between the at least two continuous encapsulation films along a transversal axis, perpendicular to the longitudinal axis of the production line, the at least one transversal insertion unit being mounted upstream of the at least two contiguous rolls along the production line.

The at least one transversal insertion unit can comprise a guiding member extending along the transversal axis and adjacent to the nip; at least one encapsulatable component feeder connected to the guiding member for supplying elongated strips of the at least one encapsulatable component; at least one actuator for pushing the elongated strips contained in the guiding member towards the nip.

The at least one encapsulatable component feeder can further comprise at least one cutting unit for cutting elongated strips from the at least one encapsulatable component. The at least one encapsulatable component feeder can further comprise at least one translatable member having a clamp for clamping the elongated strips and translating the clamped elongated strips into the guiding member. The at least one encapsulatable component feeder can further comprise a translation unit for pushing the elongated strips into the guiding member.

In an embodiment, the at least one transversal insertion unit is mounted downstream of the at least two encapsulation film supports along the production line.

According to still another general aspect, there is provided an apparatus for a continuous production of an encapsulated component web. The apparatus comprises: a production line having a longitudinal axis; at least two contiguous rolls defining a nip in between; at least two encapsulation film supports configured for supporting at least two continuous encapsulation film supplies and supplying at least two continuous encapsulation films from the at least two encapsulation film supports, the at least two encapsulation film supports being mounted upstream of the at least two contiguous rolls along the production line; at least one encapsulatable component feeder configured for supplying and inserting at least one encapsulatable component between the two continuous encapsulation films, the at least one encapsulatable component feeder being mounted upstream of the at least two contiguous rolls along the production line; and at least one transversal insertion unit for inserting at least one of the at least one encapsulatable component between the two continuous encapsulation films along a transversal axis, perpendicular to the longitudinal axis of the production line, the at least one transversal insertion unit being mounted upstream of the at least two contiguous rolls along the production line.

In an embodiment, the at least one transversal insertion unit comprises a guiding member extending along the transversal axis and adjacent to the nip; at least one encapsulatable component feeder connected to the guiding member for supplying elongated strips of the at least one encapsulatable component to the guiding member; at least one actuator for pushing the elongated strips contained in the guiding member towards the nip. The at least one encapsulatable component feeder further can comprise at least one translatable member having a clamp for clamping the elongated strips and translating the clamped elongated strips into the guiding member. The at least one translatable member can comprise a rapier. Alternatively, the at least one encapsulatable component feeder further can comprise a translation unit for pushing the elongated strips into the guiding member. The translation unit can comprise an air jet blower.

In an embodiment, the at least one guiding member is an elongated C-shape member with a front aperture oriented towards the nip.

In an embodiment, the at least one actuator comprises a hydraulic cylinder with a translatable arm for pushing the elongated strips contained in the guiding member towards the nip.

In an embodiment, the at least one encapsulatable component feeder further comprises at least one cutting unit for cutting the elongated strips from the at least one encapsulatable component.

In an embodiment, the at least one transversal insertion unit is mounted downstream of the at least two encapsulation film supports along the production line.

In an embodiment, the apparatus further comprises a lamination unit conveying the encapsulated component web along the apparatus. The lamination unit can further comprise a heating unit for heating an adhesive layer extending on at least one of the at least two continuous encapsulation films.

In an embodiment, the apparatus further comprises an adhesive layer heater, which can be mounted upstream of the nip and close to a path of at least one of the at least two continuous encapsulation films.

The at least two contiguous rolls can comprise a hard core and a resilient sleeve surrounding the hard core.

The at least two continuous encapsulation films and the at least one encapsulatable component are superposed to one another in the nip to form an assembly.

In an embodiment, the apparatus further comprises a driven roll mounted downstream of the at least two contiguous rolls along the production line and abutting the assembly.

The longitudinal axis of the production line is substantially perpendicular to a rotation axis of the two contiguous rolls.

In an embodiment, the apparatus further comprises at least one translation unit for displacing transversally at least one of the at least one encapsulatable component supplied by the at least one encapsulatable component feeder, the at least one translation unit being mounted upstream of the at least two contiguous rolls and downstream of the at least one encapsulatable component feeder along the production line, the at least one translation unit being mounted adjacent the nip.

The at least one translation unit can comprise at least one elongated track extending along the transversal axis, perpendicular to the longitudinal axis of the production line, and at least one carriage slidably mounted to the elongated track, and having at least one guide member mounted thereto, at least one of the at least one encapsulatable component being engageable with the at least one guide member and translating therewith along the transversal axis.

The at least one carriage can comprise an elongated arm protruding forwardly along the longitudinal axis and having at least one of the at least one guide member mounted to a proximal end thereof, proximal to the nip. The at least one of the at least one guide member mounted to the proximal end of the elongated arm can comprise a nozzle having an internal channel defined therein through which at least one of the at least one encapsulatable component is insertable. The nozzle can be a tapered end nozzle having an outer surface with a radius of curvature substantially corresponding to a radius of curvature of the at least two contiguous rolls.

Alternatively, the at least one of the at least one guide member mounted to the proximal end of the elongated arm can comprise a needle having a through-hole defined therein through which at least one of the at least one encapsulatable component is insertable.

The at least one translation unit can further comprise at least one belt rotatably mounted around a plurality of pulleys, extending along the transversal axis, and operatively connected to the at least one carriage. The at least one of the pulleys can be a driving pulley which engages in rotation at least one of the at least one belt and in translation at least one of the at least one carriage. The at least one belt can have a first belt section and a second belt section and at least one of the at least one carriage can be connected to the first belt section. The at least one carriage can comprise at least two carriages and the at least one belt can have a first belt section and a second belt section and a first one of the at least two carriages can be connected to the first belt section and a second one of the at least two carriages can be disconnectably connectable to the second belt section.

Alternatively, the at least one translation unit can comprise a pivotable arm having at least one guide member mounted at a proximal end thereof, proximal to the nip, at least one of the at least one encapsulatable component being engageable with the at least one guide member and pivoting therewith and pivoting therewith about a pivot point distal from the proximal end.

In an embodiment, the apparatus further comprises a controller operatively connected to the at least one translation unit.

In this specification, the term "web" is intended to mean a long, relatively thin, and flexible material. A web can include a plurality of similar or different material layers superposed to one another.

In this specification, the term "electrical conductor" is intended to include conductive wire(s) and conductive particles. The conductive wire(s) and/or conductive particles can be embedded in a textile or any other support. The electrical conductor includes, without being limitative, electrotextiles.

In this specification, the term "conductive wire" is intended to include but not limited to conductive fibers or yarns and conductive metallic wires. Conductive fibers or yarns include a non-conductive or less conductive substrate which is either coated or embedded with electrically conductive elements. The conductive wire can include a coating such as an insulating polymer providing electrical insulation.

BRIEF DESCRIPTION OF THE DRAWINGS

FIG. 2 is a schematic bottom plan view, fragmented, of the encapsulated electrical conductor web shown in FIG. 1;

FIG. 3 is a schematic cross-sectional view, exploded, of the encapsulated electrical conductor web shown in FIG. 2;

FIG. 6 is a schematic top plan view, fragmented, of an encapsulated electrical conductor web in accordance with a fourth embodiment including a transversally extending conductive wire, two spaced apart longitudinally and transversally extending conductive wires, and transversally extending non-conductive inserts which are all encapsulated between two polymeric films;

FIG. 7 is a schematic cross-sectional view along section lines 7-7 of the encapsulated electrical conductor web shown in FIG. 6;

FIG. 8 is a schematic top plan view, fragmented, of an encapsulated electrical conductor web in accordance with a fifth embodiment including a longitudinally and transversally extending conductive wire, a longitudinally extending insert, transversally extending conductive wire(s), and transversally extending insert(s) which are all encapsulated between two encapsulation films;

FIG. 9 is a schematic cross-sectional view along section lines 9-9 of the encapsulated electrical conductor web shown in FIG. 8;

FIG. 10 is a schematic side elevation view on an apparatus for manufacturing an encapsulated component web in accordance with a first embodiment;

FIG. 11 is a schematic front elevation view of the apparatus shown in FIG. 10;

FIG. 12 is a schematic side elevation view on an apparatus for manufacturing an encapsulated component web in accordance with a second embodiment, wherein a longitudinally extending electrotextile and a longitudinally extending conductive wire are encapsulated between two polymeric films;

FIG. 13 is a schematic front elevation view of the apparatus shown in FIG. 12;

FIG. 14 is a schematic top plan view of the apparatus shown in FIG. 12;

FIG. 15 is a schematic top plan view of the encapsulated component web manufactured with the apparatus shown in FIGS. 12 to 14;

FIG. 16 is a schematic side elevation view on an apparatus for manufacturing an encapsulated component web in accordance with a third embodiment, wherein two spaced apart longitudinally and transversally extending conductive wires, transversally extending non-conductive inserts, and transversally extending wires are encapsulated between two polymeric films;

FIG. 17 is a schematic front elevation view of the apparatus shown in FIG. 16;

FIG. 18 is a schematic top plan view of the apparatus shown in FIG. 16;

FIG. 19 is a schematic top plan view of the encapsulated component web manufactured with the apparatus shown in FIGS. 16 to 18;

FIG. 20 is a schematic side elevation view on an apparatus for manufacturing an encapsulated electrical conductor web in accordance with a fourth embodiment, wherein a longitudinally extending electrotextile, a longitudinally and transversally extending conductive wire, and transversally extending electrotextiles, are encapsulated between two polymeric films;

FIG. 21 is a schematic front elevation view of the apparatus shown in FIG. 20;

FIG. 22 is a schematic top plan view of the apparatus shown in FIG. 20;

FIG. 23 is a schematic top plan view of the encapsulated electrical conductor web manufactured with the apparatus shown in FIGS. 20 to 22;

FIG. 24 is a schematic front elevation view of an apparatus for displacing transversally a longitudinally extending wire to obtain an encapsulated longitudinally and transversally extending wire, wherein the apparatus includes a pivotable arm;

FIG. 25 is a schematic side elevation view of the apparatus shown in FIG. 24;

FIG. 26 is a schematic top plan view of the apparatus shown in FIG. 24;

FIG. 33 is a schematic top plan view of the apparatus shown in FIG. 31;

FIG. 34 is a schematic top plan view, enlarged, of the tapered nozzle of the apparatus shown in FIG. 31;

It will be noted that throughout the appended drawings, like features are identified by like reference numerals.

DETAILED DESCRIPTION

Figure 1:
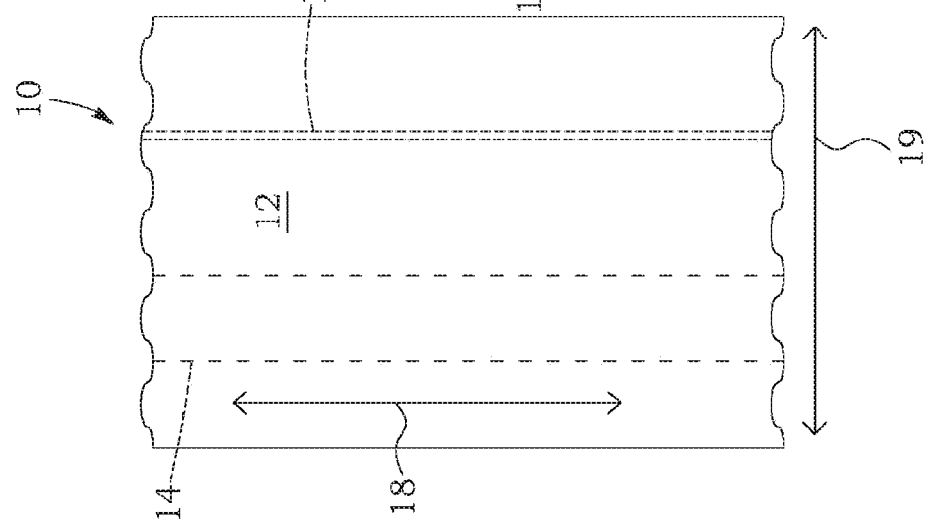
FIG. 1 is a schematic top plan view, fragmented, of an encapsulated electrical conductor web in accordance with a first embodiment wherein a longitudinally extending electrotextile and a longitudinally extending conductive wire are encapsulated between two polymeric films.
Figure 27:
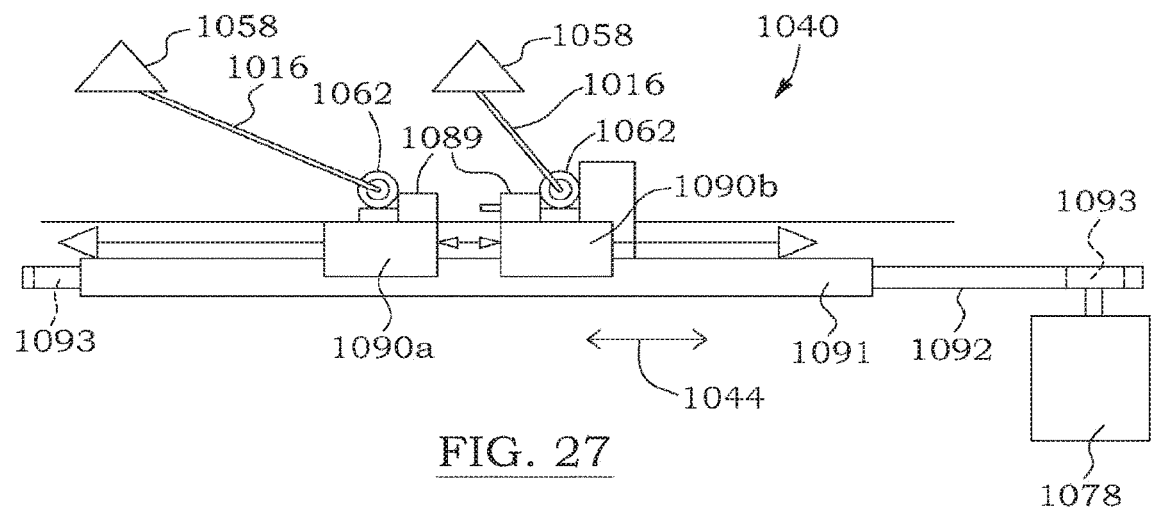
FIG. 27 is a schematic front elevation view of another apparatus for displacing transversally a longitudinally extending wire to obtain an encapsulated longitudinally and transversally extending wire, wherein the apparatus includes translatable carriages.
Figure 28:
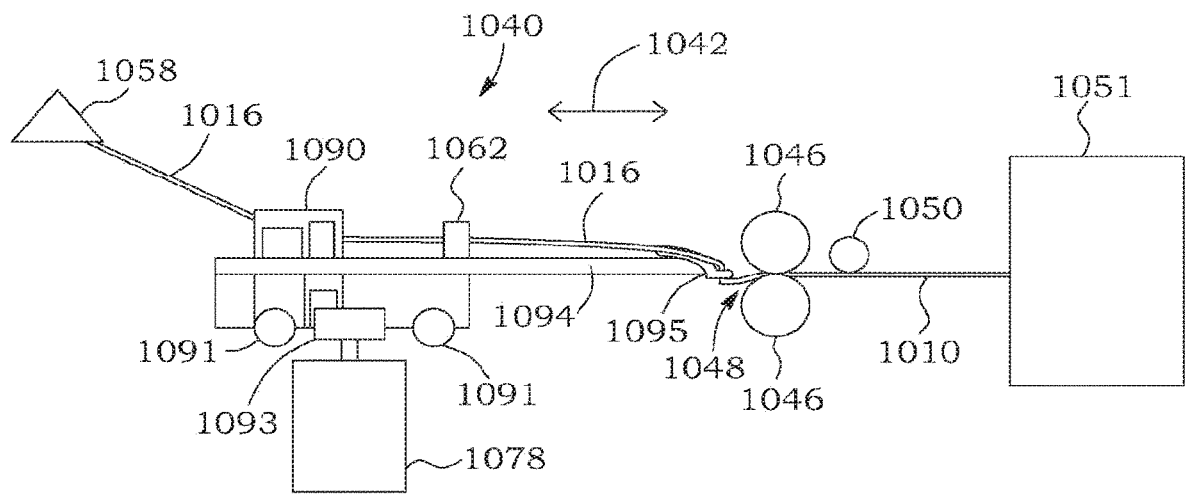
FIG. 28 is a schematic side elevation view of the apparatus shown in FIG. 27.
Figure 30:
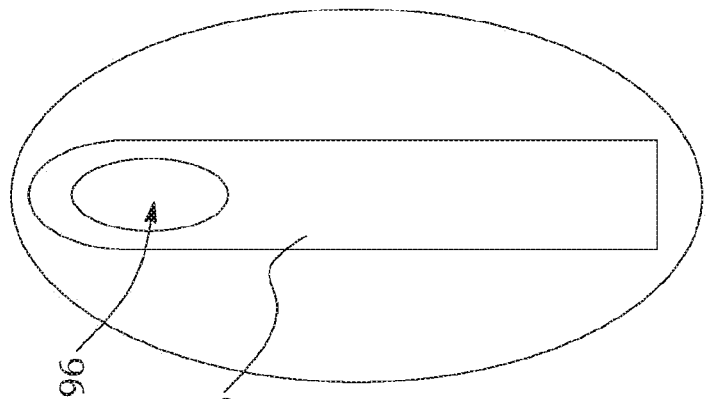
FIG. 30 is a schematic top plan view, enlarged, of a needle with its eye of the apparatus shown in FIG. 27.
Figure 29:
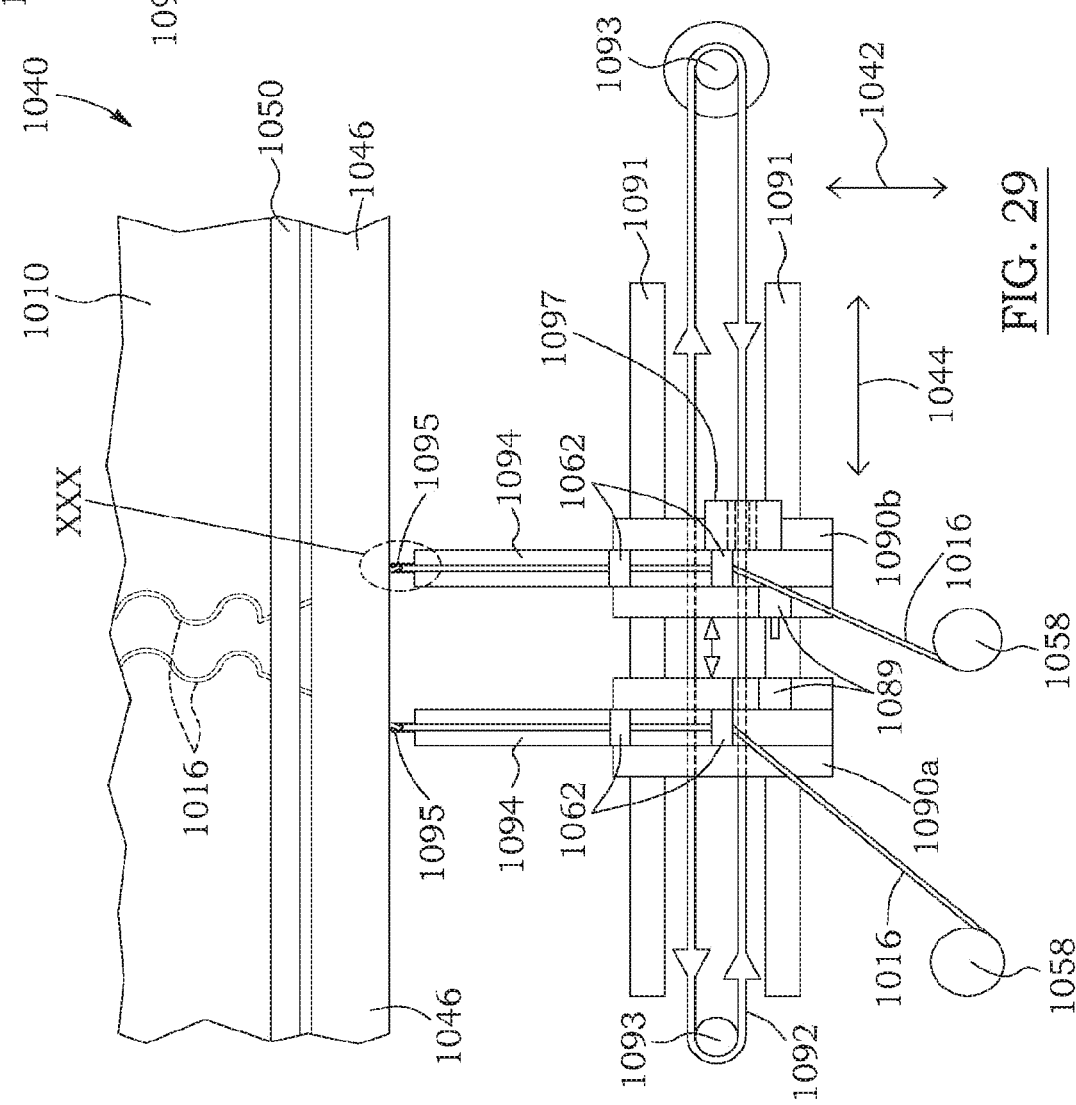
FIG. 29 is a schematic top plan view of the apparatus shown in FIG. 27.
Figure 31:
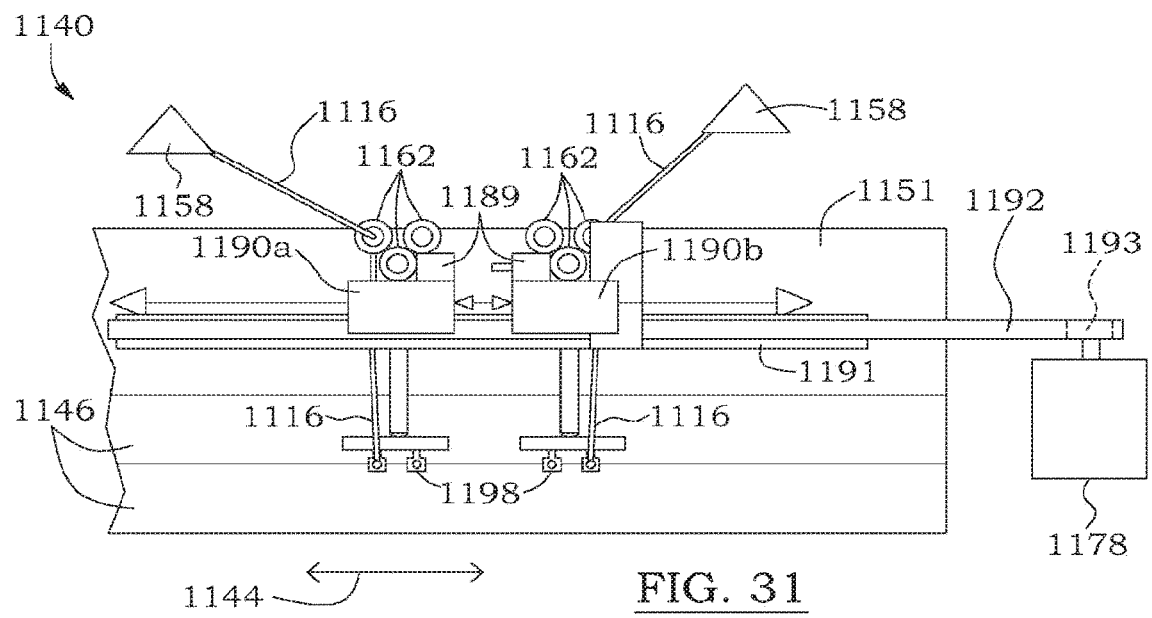
FIG. 31 is a schematic front elevation view of still another apparatus for displacing transversally a longitudinally extending wire to obtain an encapsulated longitudinally and transversally extending wire, wherein the apparatus includes tapered nozzle and a membrane heater.
Figure 32:
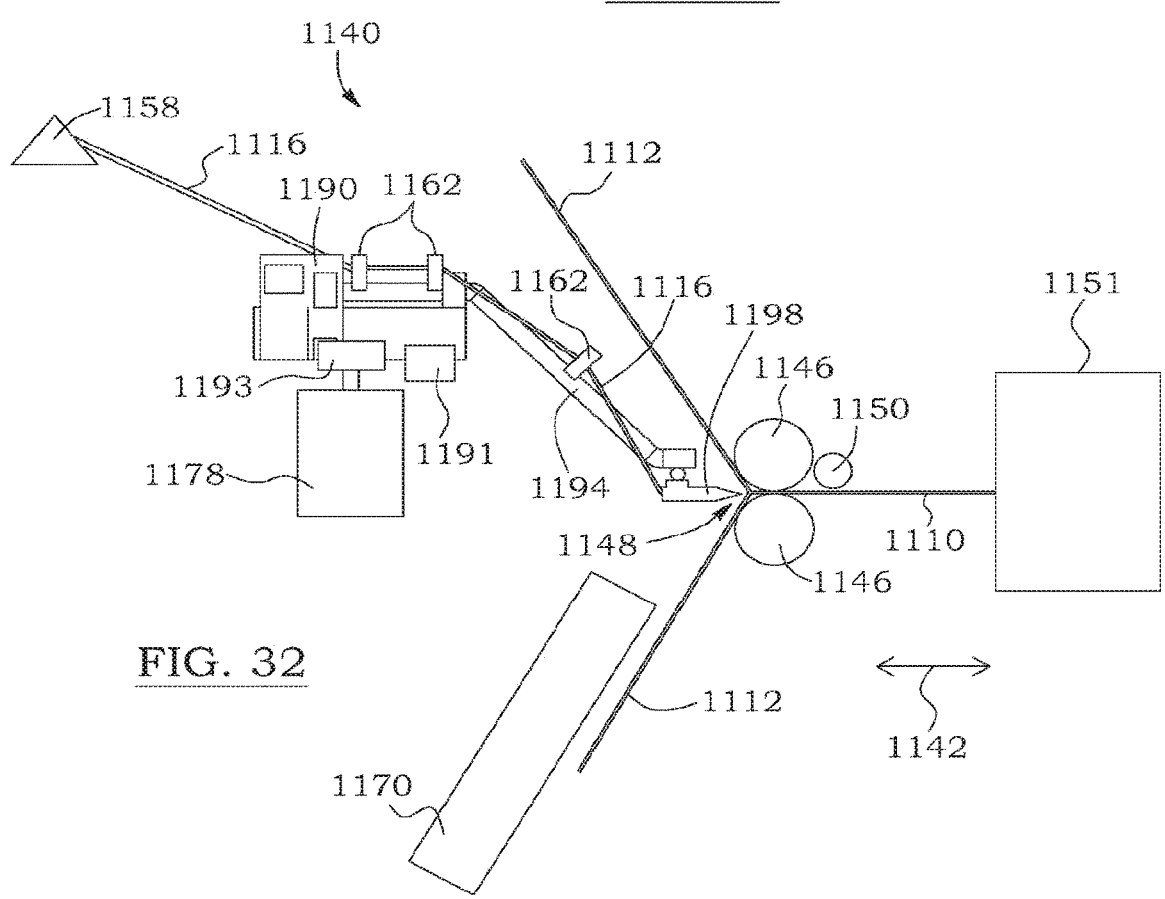
FIG. 32 is a schematic side elevation view of the apparatus shown in FIG. 31.

Referring to the drawings and, more particularly, referring to FIGS. 1 to 3, there is shown a section of an encapsulated component web 10 and, more particularly, an encapsulated electrical conductive web 10. The web 10 is manufactured by a continuous manufacturing process by an appropriate apparatus, as it will be described in more details below. Only a section of the web 10 is shown in FIGS. 1 to 3.

More particularly, the web 10 is a laminate including a plurality of superposed layers. More particularly, the web 10 includes two polymeric encapsulation films 12 encapsulating an electrotextile strip 14 and a conductive wire 16. Both the electrotextile strip 14 and the conductive wire 16 extend along a longitudinal axis 18 of the web 10, which corresponds to the longitudinal axis of a production line, as it will be described in more details below.

The electrotextile strip 14 and the conductive wire 16 are spaced apart from one another along a transversal axis 19, perpendicular to the longitudinal axis 18.

Each one of the polymeric encapsulation films 12 has an outer face which faces outwardly of the web 10 and an opposed inner face, which faces the inner face of the other polymeric encapsulation film 12. To secure the assembly including the polymeric encapsulation films 12, the electrotextile strip 14 and the conductive wire 16 together, the web 10 further includes an adhesive layer 20 extending between the two polymeric encapsulation films 12. In the embodiment shown, only an inner face of the upper polymeric encapsulation films 12b includes the adhesive layer 20. However, one skilled in the art will appreciate that in an alternative embodiment, both polymeric encapsulation films 12 can include an adhesive layer on its inner face.

One skilled in the art will appreciate that, following lamination, i.e. setting of the adhesive layer, the electrotextile strip 14 is bonded solely to the upper polymeric encapsulation films 12b. The electrotextile strip 14 is juxtaposed but not bonded to the lower polymeric encapsulation films 12a. In an alternative embodiment, the electrotextile strip 14, or any other encapsulated component, can be bonded to both the upper and lower encapsulation films 12a, 12b.

To continuously manufacture the web 10, the electrotextile strip 14 and the conductive wire 16 are conveyed continuously in the apparatus and aligned with the longitudinally axis of the production line as it will be described in more details below.

FIG. 3 shows the material layers superposed to one another when laminating the web 10. As mentioned above, the web 10 includes a lower polymeric film 12a and an upper polymeric film 12b. The adhesive layer 20 is superposed to an inner face of the upper polymeric film 12b and extends continuously thereon. The electrotextile strip 14 and the conductive wire 16 extend substantially parallel to one another between the lower polymeric film 12a and the upper polymeric film 12b. The assembly 22 including the two polymeric films 12a, 12b, the electrotextile strip 14, the conductive wire 16, and the adhesive layer 20 will be referred to as a capsule 22.

In an alternative and non-limitative embodiment, the adhesive layer 20 can be superposed to an inner face of the lower polymeric film 12a. The capsule 22 can include a first adhesive layer superposed to an inner face of the lower polymeric film 12a and a second adhesive layer superposed to an inner face of the upper polymeric film 12b. For all embodiments, the adhesive layer(s) can be continuous or discontinuous layer(s).

As shown in FIG. 3, the web 10 can further include two other support layers (or substratum) 23 extending respectively on the outer faces of the inner and outer polymeric films 12a, 12b. In the embodiment shown, the support layers 23 include a discontinuous adhesive layer 24 and a textile layer or non-conductive/electrically inert layer 26. The adhesive layers 24 extend between the outer faces of the inner and outer polymeric films 12a, 12b and the textile/non-conductive layer 26.

In an alternative and non-limitative embodiment, only one or none of outer faces of the inner and outer polymeric films 12a, 12b can be covered by the support layers 23. Furthermore, the composition of the components constituting the support layers 23 laminated outwardly of the polymeric films 12a, 12b can vary from the embodiment described above.

As it will be described in more details below, the components of the capsule 22 and the support layers 23 can vary from the above-described embodiment. For instance and without being limitative, the encapsulation films can be made of other materials than polymers and plastic films. Moreover, the upper and lower encapsulation films can be made of different materials. The conductive wire 16 can be replaced by a non-conductive yarn and/or the electrotextile strip 14 can be replaced by a non-conductive textile or any other non-conductive material such as a paper strip. The web can include only one of the conductive wire 16, the non-conductive yarn, the electrotextile strip 14 or the non-conductive strip. Furthermore, the web 10 can include more than one conductive wire 16, non-conductive yarn, electrotextile strip 14 or non-conductive strip, or any combination thereof.

In an alternative embodiment, the inner surfaces of the polymeric films 112 or any other encapsulation films can be free or substantially free of an adhesive layer. For instance, the polymeric films 112 can have themselves adhesive properties which can be activated.

Figure 4:
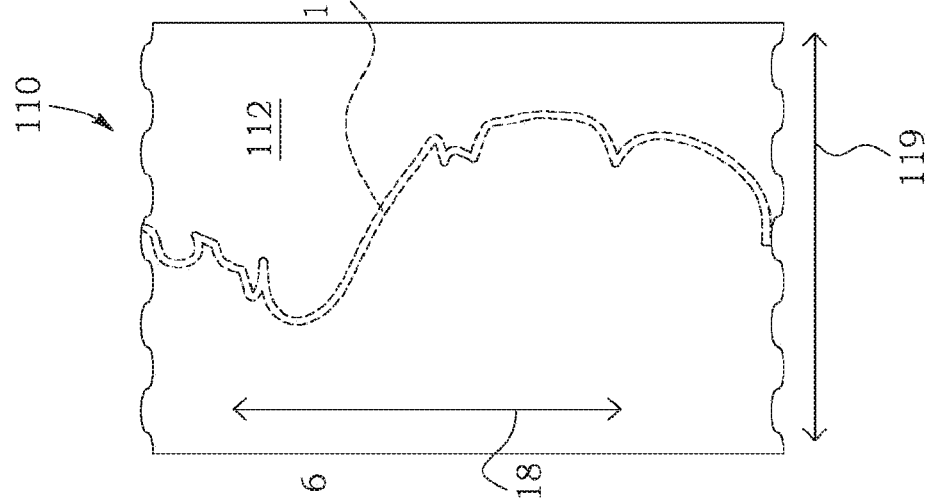
FIG. 4 is a schematic top plan view, fragmented, of an encapsulated electrical conductor web in accordance with a second embodiment including a longitudinally and transversally extending conductive wire, reproducing a wave-shaped pattern, encapsulated between two polymeric films.

Referring to FIG. 4, there is shown an alternative embodiment of the encapsulated component web 10 (only a section thereof is shown) wherein the features are numbered with reference numerals in the 100 series which correspond to the reference numerals of the previous embodiment. Both the encapsulated component webs 10, 110 are encapsulated electrical conductive webs 10, 110 because they include at least one electrical conductor. The electrical conductor can be directly encapsulated between the two encapsulation films or can be embedded in an electrotextile encapsulated between the two encapsulation films. The electrical conductor can be a conductive wire or an electrotextile including at least one of a conductive wire and conductive particles.

On the opposite of the web 10, the web 110 includes solely a conductive wire 116 encapsulated between the two polymeric films 112. The conductive wire 116 extends in an orientation not parallel to the longitudinal axis 118 of the web 110. More particularly, it extends both transversally and longitudinally along the web 110, i.e. the conductive wire 116 extends along an irregular wave shaped pattern. One skilled in the art will appreciate that the conductive wire 116 could extend along either a regular or an irregular wave shaped pattern. Wave shaped patterns include zigzag shaped patterns, oscillating patterns and any pattern including a displacement along both the longitudinal axis 118 and the transversal axis 119 and any combination thereof. The wave shaped patterns can be regular or irregular.

Figure 5:
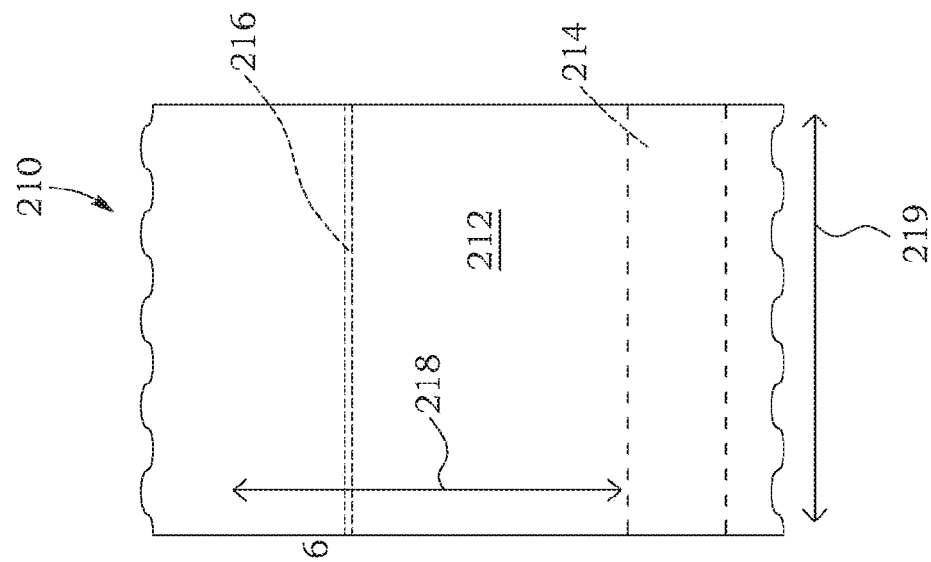
FIG. 5 is a schematic top plan view, fragmented, of an encapsulated electrical conductor web in accordance with a third embodiment including a transversally extending conductive wire and a transversally extending electrotextile which are encapsulated between two polymeric films.

Referring to FIG. 5, there is shown an alternative embodiment of the encapsulated electrical conductor webs 10, 110 wherein the features are numbered with reference numerals in the 200 series which correspond to the reference numerals of the previous embodiments. Electrotextile strips 214 (only one is shown) and conductive wires 216 (only one is shown) are encapsulated between the two polymeric films 212. The electrotextile strips 214 and the conductive wires 216 do not extend parallel to the longitudinal axis 218 but they extend in substantially perpendicular orientation to the longitudinal axis 218 of the web 210. More particularly, they extend substantially transversally along the web 210 and substantially perpendicular to the longitudinal axis of the production line. The electrotextile strip 214 and the conductive wire 216 are spaced apart from one another along the longitudinal axis 218. Thus, they are inserted sequentially while the polymeric films 212 are conveyed along the production line as it will be described in more details below. As it will be described in more details below, one skilled in the art will appreciate that the orientation of the transversally extending components can be not perfectly perpendicular to the longitudinal axis 218 of the web 210.

The spacing between two consecutive transversally extending inserts including conductive wire, non-conductive yarns, non-conductive strips, and electrotextiles can vary.

Referring to FIG. 6, there is shown an alternative embodiment of the encapsulated electrical conductor webs 10, 110, 210 wherein the features are numbered with reference numerals in the 300 series which correspond to the reference numerals of the previous embodiments. The web 310 (only a section thereof is shown) includes two spaced apart and longitudinally and transversally extending conductive wires 316a as well as a plurality of spaced apart transversally extending wires 316b (only one is shown) and a plurality of transversally extending non-conductive strips 314 (only two are shown) such as and without being limitative paper strips. As the conductive wire 116, the conductive wires 316a extend along a wave shaped pattern between the two polymeric films 312. In the embodiment shown, both conductive wires 316a, 316b have substantially the same wave shaped pattern and are substantially equidistantly spaced apart along the web 310. The transversally extending wires 316b and transversally extending non-conductive strips 314 extend substantially perpendicular to the longitudinal axis of the production line and are spaced apart from one another along the longitudinal axis 318. Thus, they are inserted sequentially while the polymeric films 312 are conveyed along the production line as it will be described in more details below.

In the embodiment shown in FIG. 6, the conductive wires 316a define a substantially regular wave (or zigzag)-shaped pattern. However, one skilled in the art will appreciate that, in an alternative embodiment, the wave (or zigzag)-shaped pattern can be irregular as the one shown in FIG. 4. Furthermore, the patterns of both conductive wires 316a are parallel. However, in an alternative embodiment (not shown), the patterns could be asymmetric.

As it will be described in more details below, insertion of transversally extending non-conductive strips 314 provides access to the longitudinally and transversally extending conductive wires 316a encapsulated between the two continuous encapsulation films 312.

One skilled in the art will appreciate that, in an alternative embodiment, at least some of the non-conductive material strips inserted transversally can be replaced by electrotextile strips. In other alternatives, the web 310 can include longitudinally extending non-conductive strips or electrotextile strips. The web 310 can further include transversally or longitudinally extending non-conductive yarns or conductive wires. At least one of conductive wires can also be replaced by a non-conductive yarn. Combinations of the above can also be provided.

FIG. 7 shows the material layers superposed to one another when laminating the web 310. As mentioned above, the web 310 includes a lower polymeric film 312a and an upper polymeric film 312b. An adhesive layer 320 is superposed to an inner face of the upper polymeric film 312b and extends continuously thereon. Both conductive wires 316 extend between the lower polymeric film 312a and the upper polymeric film 312b.

The web 310 further includes two non-conductive support layers 323 and, more particularly, two paper layers 326, superposed outwardly of the outer faces of the polymeric films 312a, 312b. A continuous adhesive layer 324 extends between the outer face of the polymeric film 312b and the upper support paper layer 326. The lower support layer 326 is laminated directly on the outer face of the polymeric film 312a. In an embodiment, the upper paper layer 326 can be peeled of the web 310 for exposing the adhesive layer 324 and mounting the web 310 to an object or a surface such as and without being limitative a textile.

One skilled in the art will appreciate that all alternative variants described in reference to FIGS. 1 to 5 are also applicable to the present embodiment. Furthermore, all variants described in reference to FIGS. 5 and 6 are also applicable to the embodiments of FIGS. 1 to 5.

Referring to FIG. 8, there is shown an alternative embodiment of the encapsulated electrical conductor webs 10, 110, 210, 310 wherein the features are numbered with reference numerals in the 400 series which correspond to the reference numerals of the previous embodiments. The web 410 (only a section thereof is shown) includes a longitudinally and transversally extending conductive wire 416a and a longitudinally extending electrotextile strip 414a as well as transversally extending wires 416b (only one is shown) and a transversally extending non-conductive strip 480. The conductive wire 416a extends along a wave shaped pattern between the two encapsulation films 412 and is spaced apart transversally from the longitudinally extending electrotextile strip 414. The transversally extending wires 416b and the transversally extending non-conductive strip 480 extend substantially perpendicular to the longitudinal axis of the production line and they are inserted sequentially while the encapsulation films 412 are conveyed along the production line as it will be described in more details below.

In the embodiment of FIG. 8, the encapsulation films 412 are not polymeric films; they are made of paper webs but could be made of other materials. One skilled in the art will appreciate that, in the above described embodiments, at least one of the polymeric films 12, 112, 212, 312 can also be replaced by non-polymeric encapsulation films. Furthermore, in an alternative embodiment, the encapsulation films 412 can include polymeric films. Furthermore, the upper and lower encapsulation films 412a, 412b can be made of different materials.

One skilled in the art will appreciate that, in an alternative embodiment, the electrotextile strips 414 extending longitudinally between both continuous encapsulation films 412 can be replaced by non-conductive material strips such as and without being limitative paper strips. Similarly, at least one of the conductive wires 416 can be replaced by a non-conductive yarn that reinforces the resulting web.

FIG. 9 shows the material layers superposed to one another when laminating the web 410. As mentioned above, the web 410 includes a lower continuous encapsulation film 412a and an upper continuous encapsulation film 412b. An adhesive layer 420 is superposed to an inner face of the upper continuous encapsulation film 412b and extends either continuously or discontinuously thereon. The conductive wire 416 and the electrotextile strips 414 extend between the lower continuous encapsulation film 412a and the upper continuous encapsulation film 412b.

The web 410 further can include two outer non-conductive support layers 423 and, more particularly, textile support layers 426, superposed outwardly to the outer faces of the continuous films 412a, 412b. Continuous or discontinuous adhesive layers 424 extend between the outer faces of the continuous films 412a, 412b and the textile support layers 426.

One skilled in the art will appreciate that all alternative variants described in reference to FIGS. 1 to 7 are also applicable to the present embodiment. Similarly, all variants described in reference to FIGS. 8 and 9 are also applicable to the embodiments described in reference to FIGS. 1 to 7.

One skilled in the art will appreciate that an infinite number of variants can be continuously manufactured by combining features of the above-detailed embodiments. The combination of non-conductive component(s) (or non-conductive insert(s)), electrotextile(s), conductive wire(s), and non-conductive yarn(s) encapsulated between the two encapsulation films, which can be polymeric films, is unlimited as well as their pattern. Any one of the non-conductive component(s) (or non-conductive insert(s)), electrotextile(s), conductive wire(s), and non-conductive yarn(s) can be inserted along the longitudinal axis, the transversal axis, and can extend along both the longitudinal and the transversal axis in a wave shaped pattern.

For all the above-described embodiments, the continuously extending encapsulation films 12, 112, 212, 312, 412 encapsulating the conductive or non-conductive components can be made of polymeric films or any other relatively thin material layers including but not limited to paper layers, metallic foil layers, and the likes. One skilled in the art will appreciate that the materials of the upper and lower continuously extending encapsulation films 12, 112, 212, 312, 412 can differ from the above-detailed embodiments.

In an embodiment, the continuously extending encapsulation films 12, 112, 212, 312, 412 are either hydrophilic or hydrophobic monolithic or microporous polymeric films. For instance, the polymeric films can be of aliphatic or aromatic chemistry. In an embodiment, the continuously extending encapsulation films 12, 112, 212, 312, 412 include a polyurethane film, a polyester film, a polyamide film, a polypropylene film, a polyethylene film, a PVC film, a polycarbonate film, a neoprene film, a rubber film, and the like. The polymeric film can have a thickness below 1 millimeter and, in an embodiment, below 500 µm and a grammage below 500 grams per square meter and, in an embodiment, below 300 grams per square meter. The film can be applied at a temperature ranging between about 100° C. and 180° C. In an embodiment, it has a moisture vapour transmission rate below 10 000 grams per square meter per 24 hours (ASTM BW 96-00).

For instance and without being limitative, the adhesive layer(s) 20, 24 can include a heat activated adhesive such as a thermoplastic adhesive or a thermoset adhesive such as polyurethanes, polyethylene, ethylene vinyl acetate (EVA), polypropylene, copolyester, copolyamide, acrylics, and the like. In an embodiment, each one of the adhesive layer(s) 20, 24 has a thickness below 500 µm and a grammage below 300 grams per square meter. One skilled in the art will appreciate that the composition of adhesive layer(s) 20 can differ from the composition of adhesive layer(s) 24. The adhesive(s) can be applied at a temperature ranging between about 80° C. and 200° C. In an embodiment, it has a moisture vapour transmission rate below 10,000 grams per square meter per 24 hours (ASTM BW 96-00).

The adhesive layer(s) 20, 24 can also include a pressure sensitive adhesive. It could also include an adhesive in liquid state which is applied to the inner face of the encapsulation film while it is conveyed along the production line.

For instance and without being limitative, the support layer(s) 23 can include textile based layers, metallic foil based layers or polymeric support layers including cellulosic or paper-based support layers. One skilled in the art will appreciate that paper contains cellulose which is a polymer of glucose. In an embodiment, the support layer 23 includes a paper-based support layer having a thickness below 1 millimeter and, in an embodiment, below 500 µm and a grammage below 500 grams per square meter and, in an embodiment, below 300 grams per square meter. In an embodiment, the application temperature is below 200° C. In another embodiment, the support layer 23 includes either a polyethylene film or a polypropylene film having a thickness below 1 millimeter and, in an embodiment, below 500 µm and a grammage below 500 grams per square meter and, in an embodiment, below 300 grams per square meter. In an embodiment, the application temperature is below 180° C.

The electrotextiles or non-conductive strips encapsulated between the two continuously extending encapsulation films 12, 112, 212, 312, 412 are narrow material strips (in comparison with the encapsulation films 12, 112, 212, 312, 412). They can include woven, non-woven, and knitted textiles for instance.

Woven fabrics or textiles are worked on a loom and made of many threads woven on a wrap and a weft. Woven textiles include, for instance and without being limitative, plain weave, twill, sateen, fancy, and the like having a thickness below 5000 µm and a grammage below 500 grams per square meter. Non-conductive and conductive wires or yarns can be embedded in the woven textile as it will be described in more details below.

Knitted fabrics or textiles are made from a single yarn or a set of yarns. In making cloth, a knitting machine forms loops in the yarn and links them to one another by means of needles. Knitted textiles include, for instance and without being limitative, wrap knit, circular knit (jersey and double knit), and the like having a thickness below 5000 m and a grammage below 500 grams per square meter. Non-conductive and conductive wires or yarns can be embedded in the knitted textile as it will be described in more details below.

Non-woven fabrics or textiles are fabric-like materials made from long fibers, bonded together by chemical, mechanical, heat or solvent treatment. Non-woven textiles include, for instance and without being limitative, needle punched, air laid, and the like made of natural and/or man-made fibers having a thickness below 5000 µm, a grammage below 1000 grams per square meter, a decitex below 10 dtex (Unit of the linear density of a continuous filament or yarn), and a fiber length between about 20 and 100 millimeters. Conductive fibers, including silver, copper, titanium, stainless steel, and mixture thereof, can be embedded in the non-woven textile as it will be described in more details below.

Non-conductive strips can be inserted between the two continuously extending encapsulation films 12, 112, 212, 312, 412 to provide access to the conductive wires or the conductive fibers (which can be embedded in an electrotextile) or to reinforce the resulting web. The non-conductive strips can include, for instance and without being limitative, paper strips or coated paper strips. For instance, the paper strips can be coated with silicon, Teflon®, waxed coating on one or both sides. The coating prevents permanent bonding of the non-conductive strip to the continuously extending encapsulation films 12, 112, 212, 312, 412 coated with an adhesive layer. The non-conductive strip can have a thickness below 500 µm and a grammage below 300 grams per square meter.

Textile non-conductive strips can also be encapsulated between the two continuously extending encapsulation films 12, 112, 212, 312, 412 to reinforce the resulting web. As the encapsulated electrotextiles, the textile strips can be woven, non-woven or knitted strips, which include non-conductive fibers or yarns. The textile non-conductive strips can be characterized by the same composition and physical properties as the electrotextiles described above.

The conductive wires or yarns encapsulated between the two continuously extending encapsulation films 12, 112, 212, 312, 412, which can be embedded in an electrotextile or directly encapsulated between the two continuously extending encapsulation films 12, 112, 212, 312, 412, can be multifilament, core, spun, or monofilament yarns. The conductive wires are for data and energy transport. The yarns are made up of a number of plies, each ply being a single multifilament, a core yarn, a monofilament, and/or a spun yarn. Multifilament yarns or wires are strings that have more than one filament (pure or blends). Core yarns or wires are manufactured by winding or wrapping (covering) a flattened metallic strip made from pure gold, silver or slitted metalized polyester film, on a core yarn, usually of pure silk, art silk, viscose, cotton, nylon, polyester, and polypropylene. Monofilament yarns or wires are yarns made of one continuous single fiber, e.g. string.

The conductive wires can be made of silver, stainless steel, copper, titanium, gold, carbon fibers, and/or any metal coated short staples and the like. The conductive wires can be coated or non-coated. Coatings can include any insulating polymer providing electrical insulation. Coatings can also be applied to non-conductive yarns.

The conductive wires can be characterized by a decitex below 1100 dtex, a total denier per quantity of uniform filaments (D.P.F.) below 10, a twist below 50 turns per centimeter, and by a diameter smaller than about 5 millimeters. The conductive wire can be single ply or multiple plies.

Non-conductive yarns can also be embedded and encapsulated between the two continuously extending encapsulation films 12, 112, 212, 312, 412. The non-conductive yarns can be embedded in an electrotextile or a textile. The non-conductive yarns reinforce the resulting web. The non-conductive yarns can be characterized by the same composition and physical properties as the electrical wires described above without the electrical conductive component(s). The non-conductive yarns can be coated or non-coated.

The encapsulated electrotextile strips or pieces are narrower along the transversal axis than the continuously extending encapsulation films 12, 112, 212, 312, 412.

The terminology "electrical conductor" includes conductive yarns and electrotextiles since they include either conductive wire(s) or particles. Thus, electrical wires and electrotextiles including conductive wire(s), conductive yarn(s) and/or conductive particles can be encapsulated between the two encapsulation films.

The electrotextile(s), the conductive wire(s) including the conductive yarn(s), the non-conductive yarn(s), and the non-conductive material strip(s) including the paper and non-conductive textile strip(s) can be inserted between the encapsulation films 12, 112, 212, 312, 412 in a longitudinal orientation or transversal orientation. They can also define a regular or an irregular wave shaped pattern wherein they extend along both the longitudinal and the transversal axes.

Referring now to FIGS. 10 and 11, there is shown an embodiment of an apparatus 540 for continuously manufacturing an encapsulated electrical conductor web 510 described above. The apparatus 540 has a longitudinal axis 542, which corresponds to the longitudinal axis of the production line, and a transversal axis 544, which is perpendicular to the longitudinal axis. The apparatus 540 includes two contiguous driven rolls 546a, 546b defining therebetween a nip 548 through which all the layers of the web 510 are superposed to one another and maintained firmly in their superposed position. The rolls 546a, 546b rotate in opposite directions and are driven in rotation by the web 510 that is conveyed in the nip 548. They apply a pressure on the web 510 inserted in the nip 548 to prevent displacement of the layers relatively to one another. One skilled in the art will appreciate that the apparatus 540 can include more than two rolls 546a, 546b defining a nip 548 in between. The nip 548 is the contact area between the contiguous rolls 546a, 546b wherein all the layers of the web 510 are gripped together.

In a non-limitative alternative embodiment, the apparatus 540 can include at least two sets of consecutive and contiguous rolls wherein the inner layers of the web 510 are pressed together in the first set and the outer layers are superposed to the inner layers of the web 510 in the subsequent set(s) of contiguous rolls.

A smaller driven roll 550 is mounted downstream of the two rolls 546a, 546b, above the web 510. The driven roll 550 abuts the web 510 and maintains a pressure thereon to prevent displacement of the layers relatively to one another and smooth the displacement of the web 510 along the production line. The driven roll 550 is conveyed in rotation by the web 510.

Downstream of the driven roll 550, the web 510 is conveyed in a lamination unit 551. All layers constituting the web 510 are bonded together in the lamination unit 551, i.e. the adhesive is allowed to set. The adhesive layer(s) are activated for bonding all the components in the lamination unit 551, including the films 512, together. Depending on the nature of the adhesive(s) contained in the web 510, the adhesive activation and setting parameters can vary. Typically, heat and pressure will be applied during a period of time. The temperature and the pressure applied as well as the time period will vary in accordance with the components of the web 510. In the lamination unit 551, the adhesive(s) are activated and set, for instance they can be cured, reticulated, etc.

The lamination unit 551 conveys the web 510 along the apparatus 540. In other words, it pulls the various web components towards it and controls the speed of the production line. Along its path, the web components go through the two contiguous rolls 546 wherein they are mechanically superposed to one another. The two contiguous rolls 546 pre-laminate the web components.

Following the lamination unit 551, the bonded web 510 can be conveyed to a cutting unit wherein the web 510 is cut into either elongated strips or panels.

Alternatively, following the lamination unit 551, the bonded web 510 can be rolled into a roll for transport and/or storage purposes.

The encapsulation films 512, for instance the polymeric films, are conveyed continuously to the production line. In an embodiment, they are provided in rolls (not shown), for instance, polymeric film rolls. The apparatus 540 thus includes encapsulation film supports (not shown) from which the encapsulation films are supplied to the production line. The shape of the encapsulation film supports varies in accordance with the shape of encapsulation film supplies being fed to the apparatus 540. Since electrical conductors, electrical wires and/or electrotextiles, or other non-conductive components, non-conductive yarns and/or non-conductive strips, are embedded between the two encapsulation films 512, the encapsulation film supports are spaced apart from one another. The apparatus 540 can include one or several rolls or other carriers for supporting the encapsulation films 512 from the encapsulation film supports to the two contiguous rolls 546a, 546b.

As mentioned above, the apparatus 540 is designed for continuously manufacturing continuous electrical conductors, electrical wires and/or electrotextiles, or other non-conductive components, non-conductive yarns and/or non-conductive strips, encapsulated between two encapsulation films 512. Typically, the encapsulation films and the encapsulatable components are supplied continuously. One skilled in the art will appreciate that the process and the corresponding apparatus are continuous process and apparatus even if they must be temporarily stopped (or slowed down) for supplying a new encapsulation film supply or encapsulatable component supply when the previous supply is emptied.

Similarly, the encapsulatable components, including the electrical conductors (electrical wires and/or electrotextiles) or other non-conductive components (non-conductive yarns and/or non-conductive strips), which extend either along the longitudinally extending axis of the web or along both the longitudinally and transversally extending axes, i.e. having a wave shaped pattern (either irregular or regular), are also conveyed continuously along the production line towards the nip 548. The encapsulatable components are continuously supplied to the apparatus 540 from rolls (not shown). Thus, the apparatus 540 can include the associated roll supports (not shown) from which they are supplied. The shape of the supports varies in accordance with the shape of material supplied. The apparatus can include one or several rolls or other carriers (not shown) for supporting each one of the encapsulatable components towards the nip 548.

The rolls or carriers are positioned in a manner such that the position of the encapsulatable components, i.e. the electrical wires, the electrotextiles, the non-conductive yarns, and/or the non-conductive strips, adjacent to the nip 548 corresponds to the predetermined position of the encapsulatable components when the latter are in the nip 548 and when all the components of the web are gripped together. Once all the components are gripped together by the two contiguous rolls 546a, 546b their relative positions remain substantially unchanged for the downstream manufacturing steps of the apparatus 540 and the production line.

As shown in FIG. 10 and as mentioned above, encapsulatable components, i.e. the electrical conductors, the electrotextiles, the non-conductive yarns, and/or the non-conductive strips, can be embedded transversally in the web. The transversally extending encapsulatable components are inserted between the two encapsulation films 512 close to the nip 548. In an embodiment, they are inserted between the two encapsulation films 512 in the closest position as possible relatively to the nip 548 to prevent displacement of the transversally extending encapsulatable components relatively to the two encapsulation films 512 and the other components before they are gripped together into an assembly by the contiguous rolls 546a, 546b.

As mentioned above, the transversally extending encapsulatable components are inserted between the encapsulation films 512 while the latter are conveyed continuously along the production line. Thus it is appreciated that the orientation of the transversally extending encapsulatable components can be not perfectly transversal to the longitudinal axis 542. By the time the transversally extending encapsulatable component is inserted transversally along the apparatus 540, both encapsulation films 512 have been conveyed forwardly. Thus, one of the proximal end and the distal end of the transversally extending encapsulatable component can be positioned slightly forwardly of the other one of the proximal end and the distal end. An alternative embodiment of a component for inserting transversally an encapsulatable component will be described below in reference to FIGS. 35 and 36.

Referring to FIGS. 12 to 14, there is shown an apparatus 640 for manufacturing an encapsulated electrical conductor web in accordance with an embodiment, wherein a longitudinally extending electrotextile 614 and a longitudinally extending conductive wire 616 are encapsulated between two polymeric films 612. As the apparatus of FIGS. 11 and 12, the apparatus 640 includes two contiguous rolls 646 defining the nip 648, a roller 650 and a lamination unit 651.

The polymeric films 612 and the encapsulatable components, including the electrotextile 614 and the conductive wire 616 are gripped together in the nip 648.

The encapsulating polymeric films 612, the electrotextile 614, and the conductive wire 616 are conveyed continuously along the production line. The encapsulating polymeric films 612 and the electrotextile 614 are provided in rolls 654, 656, respectively. The conductive wire 616 is also provided from a continuous supply 658. As the apparatus 540, the apparatus 640 can also include one or several rolls or other carriers (not shown) for supporting the encapsulating polymeric films 612, the electrotextile 614, and the conductive wire 616 to the two contiguous rolls 646.

The polymeric film supply can include the polymeric film, the adhesive layer, and the support layer(s), if any, that are laminated to the polymeric film. In other words, the rolls 654 can supply, to the apparatus 640, a laminate including an inner continuous or discontinuous, adhesive layer, a polymeric film (or any other encapsulation film), and a support layer including, for instance, a continuous or discontinuous adhesive layer and an outer non-conductive layer such as a paper layer.

Referring now to FIG. 15, there is shown a section of the continuously manufactured web 610. Two longitudinal strips 660a, 660b are cut in the web 610. The first longitudinally extending strip 660a includes the electrotextile 614 and the encapsulating polymeric films 612 encapsulating the electrotextile 614 and sections thereof extending laterally on each side of the electrotextile 614. The second longitudinally extending strip 660b includes the conductive wire 616 and the encapsulating polymeric films 612 encapsulating the conductive wire 616 and sections thereof extending laterally on each side of the conductive wire 616.

If the web 610 includes a support layer with an exposable adhesive layer, the outer adhesive layer can be exposed, for instance, by peeling off the support layer, and the web 610 including the electrical conductor 614, 616 can be applied to a surface such as a textile or a fabric.

Referring to FIGS. 16 to 18, there is shown an apparatus 740 for manufacturing an encapsulated electrical conductor web in accordance with an embodiment, wherein two longitudinally extending conductive wires 716a are encapsulated between two polymeric films 712. The web 710 further includes transversally extending electrotextiles 780 and transversally extending electrical wires 716b. As the apparatuses of FIGS. 11 to 14, the apparatus 740 includes two contiguous rolls 746 defining the nip 748, a roller 750 and a lamination unit 751. These features are described above in reference to FIGS. 11 to 14.

The polymeric films 712 and the encapsulatable components, including the electrotextile 780 and the conductive wires 716a, 716b are gripped together in the nip 748.

The encapsulating polymeric films 712 and the conductive wires 716a are conveyed continuously along the production line. The encapsulating polymeric films 712 are provided in rolls 754. The conductive wire 716a is also provided from a continuous supply 758. As the apparatuses 540, 640, the apparatus 740 can also include one or several rolls or other carriers for supporting and conveying the encapsulating polymeric films 712 and the conductive wire 716a to the two contiguous rolls 746. For instance, the conductive wires 716a are guided by the guiding eyelets 762. More particularly, the guiding eyelets 762 are stationary members having an aperture defined therein through which the conductive wires 716a are slidably inserted.

As mentioned above, the conductive wires 716a define a wave shaped pattern between the two encapsulating polymeric films 712. To define the wave shaped pattern, the position of the conductive wires 716a upstream the nip 748 is displaced as the encapsulating polymeric films 712 are conveyed along the production line. In a non-limitative embodiment, the apparatus 740 includes a transversally extending rail 761 provided close to the two contiguous rolls 746, between the two encapsulating polymeric films 712. One or several needles (not shown) are slidably mounted to the rail 761. Each one of the conductive wires 716a is inserted in a respective one of the needles and is slidably displaced along the rail 761 therewith. Thus, to create the wave shaped pattern, as the encapsulating polymeric films 712 and the conductive wires 716a are conveyed along the production line, the needles are displaced along the rail 761. To create parallel patterns, the needles are displaced simultaneously, by the same distance, and in the same direction along the rail 761. However, one skilled in the art will appreciate that the needles can be displaced in opposite directions and/or by a different distance. For instance, irregular non-parallel patterns can thus be created. In non-limitative alternative embodiments, all the needles can be mounted on one carrier displaceable on a rail or any other track unit or each one of the needles can be mounted on its own carrier displaceable on a rail or any other track unit or any combination thereof. One skilled in the art will appreciate that the apparatus 740 can include two or more rails 761.

To control the position of the conductive wires 716a when encapsulated between the two encapsulating polymeric films 712, the rail 761 including the needles are positioned close to the nip 748. In some embodiment, it may be required to displace the needles by a greater distance along the rail 761 than the resulting wave shaped pattern.

One skilled in the art will appreciate that other mechanisms can be designed to create the longitudinally and transversally extending patterns. Non-limitative embodiments thereof will be described below in reference to FIGS. 24 to 36. For instance, in a non-limitative embodiment, the assembly including the rolls 746 and the encapsulating polymeric films 712 are displaced relatively to stationary conductive wire supplies.

Elongated strips of non-conductive material 780 and electrical wire sections 716b are inserted transversally between the two encapsulating polymeric films 712, close to nip 748. Weaving mechanisms can be used to insert transversally the non-conductive material strips 780 and/or electrical wire sections 716b between the two encapsulating polymeric films 712. The apparatus 740 with the angle defined by the two encapsulating polymeric films 712 can be associated to a shed in a weaving apparatus. The non-conductive material strips 780 and/or electrical wire sections 716b can be inserted between the two encapsulating polymeric films 712 by a picking mechanism to which the non-conductive material strips 780 and/or electrical wire sections 716b is attached such as and without being limitative a shuttle, a rapier, a projectile, pneumatic, combinations thereof, etc. The non-conductive material strips 780 and/or electrical wire sections 716b are inserted between the two encapsulation films 712 in the closest position as possible relatively to the nip 748 to prevent displacement of the transversally extending encapsulatable components relatively to the two encapsulation films 712 and the other components before they are gripped together into an assembly by the contiguous rolls 746. Alternative embodiments of components for inserting transversally extending encapsulatable components will be described below in reference to FIGS. 35 and 36.

One skilled in the art will appreciate that other components can be inserted transversally including non-conductive yarns and electrotextile strips. As detailed above, the non-conductive material strips 780 can include, without being limitative, paper and textile strips.

As for the embodiment described above in reference to FIGS. 12 to 15, the polymeric film supply can include the polymeric film, the adhesive layer, and the support layer(s), if any, that are laminated to the polymeric film. In other words, the rolls 754 can supply, to the apparatus 740, a laminate including an inner continuous or discontinuous, adhesive layer, a polymeric film (or any other encapsulation film), and a support layer including, for instance, a continuous or discontinuous adhesive layer and an outer non-conductive layer such as a paper layer.

Referring now to FIG. 19, there is shown a section of the continuously manufactured web 710. A piece 760 is cut in the web 710. The piece 760 includes two spaced apart sections of the transversally extending non-conductive strips 780, a section of the two transversally and longitudinally extending conductive wires 716a, and a section of the transversally extending conductive wire 716b. The piece 760 is slightly larger than the width of the two transversally and longitudinally extending conductive wires 716a. The transversally extending non-conductive strips 780 provide access to the conductive wire sections 716a, 716b which are all encapsulated in the capsule 722.

Referring to FIGS. 20 to 22, there is shown an apparatus 840 for manufacturing an encapsulated electrical conductor web in accordance with an embodiment, wherein an electrotextile strip 814a and a longitudinally extending conductive wire 816a are encapsulated between two polymeric films 812. The web 810 further includes transversally extending electrotextiles 814b and transversally extending electrical wires 816b. As the apparatuses of FIGS. 11 to 14 and 16 to 18, the apparatus 840 includes two contiguous rolls 846 defining the nip 848, a roller 850 and a lamination unit 851. These features are described above in reference to FIGS. 11 to 14 and 16 to 18.

The polymeric films 812 and the encapsulatable components, including the electrotextile 814a, 814b and the conductive wires 816a, 816b are gripped together in the nip 848.

The encapsulating polymeric films 812, the electrotextile strip 814a, and the conductive wires 816a are conveyed continuously along the production line. The encapsulating polymeric films 812 are provided in rolls (not shown). The electrotextile strip 814a and the conductive wire 816a are also provided from a continuous supply 858 (only one is shown). As the apparatuses 540, 640, 740, the apparatus 840 can also include one or several rolls or other carriers for supporting and conveying the encapsulating polymeric films 812 and the conductive wire 816a to the two contiguous rolls 846.

As mentioned above, the conductive wire 816a defines a wave shaped pattern between the two encapsulating polymeric films 812. The systems described above in reference to FIGS. 16 to 18 can be used to create the wave shaped pattern of the conductive wire 816a between the two encapsulating polymeric films 812.

Elongated strips of electrotextiles 814b and electrical wire sections 716b are inserted transversally between the two encapsulating polymeric films 712, close to nip 748. Weaving mechanisms such as the ones described above can be used to insert transversally the electrotextiles 814b and/or electrical wire sections 816b between the two encapsulating polymeric films 812 and will not be described in further details.

As for the above-described embodiments, one skilled in the art will appreciate that other components can be inserted transversally including non-conductive yarn(s) and non-conductive material strip(s) including paper and textile strips.

As for all of the above-detailed embodiments, at least one of the polymeric film supplies can include the polymeric film, the adhesive layer, and the support layer(s), if any, that are laminated to the polymeric film. In other words, the rolls 854 can supply, to the apparatus 840, a laminate including an inner continuous or discontinuous, adhesive layer, a polymeric film (or any other encapsulation film), and a support layer including, for instance, a continuous or discontinuous adhesive layer and an outer non-conductive layer such as a paper layer. Referring now to FIG. 23, there is shown a section of the continuously manufactured web 810.

Referring now to FIGS. 24, 25, and 26, there is shown an apparatus 940 for displacing transversally an elongated encapsulatable component along a production line having a longitudinal axis 942, which will be referred below as an elongated wire 916, which can be a conductive wire, while it is conveyed along the production line to obtain a longitudinally and transversally extending wire encapsulated between two continuous encapsulation films, such as and without being limitative polymeric films. The apparatus 940 can be combined with any one of the apparatuses described above or can include features thereof. In the embodiment shown in FIGS. 24, 25, and 26, the apparatus 940 further includes a pivotable arm 982 to displace transversally the elongated wire 916, as it is conveyed along the production line, prior to its encapsulation between the encapsulation films (not shown). Thus, when grasped by the two contiguous rolls 946, the position of the elongated wire 916 along the transversal axis 944 is variable.

More particularly, the pivotable arm 982 has a distal end 983 and an opposed proximal end 984, close to the contiguous rolls 946. The pivotable arm 982 pivots about a pivot point 985, close to its distal end 983. Two guiding eyelets 962 are provided along the pivotable arm 982. The pivotable arm 982 further includes a comb 986 provided at its proximal end 984. Thus, an elongated wire 916 conveyed between two encapsulation films is first supplied from a wire supply 958, which acts as encapsulatable component feeder, extends longitudinally along the pivotable arm 982 into both guiding eyelets 962 and into the comb 986.

A pneumatic cylinder 987 is provided close to the distal end 983 of the pivotable arm 982 and, more particularly, the pneumatic cylinder 987 has a translatable arm 988 operatively connected to the pivotable arm 982 between its distal end 983 and the pivot point 985. Thus, by translating the translatable arm 988 of the pneumatic cylinder 987 between an expanded configuration and a contracted configuration, the pivotable arm 982 pivots about its pivot point 985. Simultaneously, the comb 986 is also displaced transversally. More particularly, as shown in FIG. 26, the comb 986 is displaced along an arc of circle. Thus, the elongated wire 916, extending therein, is displaced transversally while it is conveyed along the production line and just before being grasped by the contiguous rolls 946 and sandwiched between the two encapsulation films. In the resulting encapsulated component web, the elongated wire 916 extends along both the longitudinal and the transversal axes of the web, as detailed above. The displacement pattern of the elongated wire 916 is thus controllable through the pneumatic cylinder 987.

To control the displacement pattern of the elongated wire 916, the pneumatic cylinder 987 can be operatively connected to a controller (not shown) which controls the translation of the translatable arm 988. The controller can also be operatively connected to the rolls of the lamination unit 951 to either measure or control their rotation speed. As mentioned above, the lamination unit 951 pulls the various web components towards it and controls the speed of the production line.

The controller can include an algorithm to calculate the movements of the actuator based on variables such as, without being limitative, the predetermined pattern for the elongated wire(s), the speed of the encapsulating films, the distance between the comb and the nip, etc.

One skilled in the art will appreciate that the comb 986, or any other guiding member, is provided as close as possible to the nip 948 for better control on the elongated wire position, along the transversal axis 944, when grasped by the contiguous rolls 946. For instance, the distance between the most proximal guiding member, i.e. the one located closest to the nip 948, and the nip 948 is smaller than about 10 millimeters and, in an alternative embodiment, smaller than about 6 millimeters.

One skilled in the art will appreciate that more or less guiding eyelets 962 can be mounted to the pivotable arm 982. Furthermore, the guiding eyelets 962 and the comb 986 can be replaced by other guiding members connected to the pivotable arm 982 for guiding the elongated wire 916 along the latter. Non-limitative embodiments of other guiding members will be described below. Similarly, the pneumatic cylinder 987 can be replaced by other actuator suitable for pivoting the pivotable arm 982.

One skilled in the art will appreciate that the apparatus 940 can include two or more pivotable arms 982 if more than one elongated wire 916 is encapsulated between the encapsulation films. The pivotable arms 982 can be operatively connected to the same actuator, such as the pneumatic cylinder 987, if their patterns are similar or substantially parallel to one another or to different actuators, i.e. each pivotable arm 982 has its own actuator to which it is operatively connected.

Alternatively, more than one elongated wire 916 can extend along one pivotable arm 982. The elongated wires 916 can extend in the same or different guiding eyelets but in different spaces defined between teeth of the comb 986.

Referring now to FIGS. 27, 28, 29, and 30, there is shown another apparatus 1040 for displacing transversally an elongated wire 1016, as it is conveyed along the production line, to obtain a longitudinally and transversally extending wire encapsulated between two continuous encapsulation films (not shown). As the above-described embodiment, the apparatus 1040 can be combined with any one of the apparatuses described above or can include features thereof.

In the embodiment shown in FIGS. 27, 28, 29, and 30, the apparatus 1040 includes two translatable carriages 1090a, 1090b slidably mounted to two spaced apart elongated tracks and, more particularly, rail members 1091, extending along the transversal axis 1019. The carriages 1090a, 1090b are also operatively connected to a belt 1092 extending around two pulleys 1093. A first one 1090a of the carriages is connected to a proximal section of the belt 1092, i.e. the one located close to the nip 1048. A second one 1090b of the carriages is selectively connectable to the first one 1090a of the carriages and a distal section of the belt 1092, the one located farther from the nip 1048, as it will be described in more details below.

Each one of the carriages 1090a, 1090b has an elongated arm 1094 protruding forwardly. The elongated arms 1094 are provided with a plurality of guiding eyelets 1062 to guide the elongated wire 1016 towards the contiguous rolls 1046. Each one of the elongated arms 1094 ends with a needle 1095 having an eye 1096 (or through-hole) through which the elongated wire 1016, conveyed along the production line, extends.

As mentioned above, the second one 1090b of the carriages is selectively connectable to the first one 1090a of the carriages and the distal section of the belt 1092. Both carriages 1090a, 1090b are provided with complementary biasing members 1089 and, more particularly, magnets which bias the second one 1090b of the carriages towards the first one 1090a of the carriages, i.e. they are attracted towards one another. Thus, the second carriage 1090b follows the displacement of the first carriages 1090a along the rail member 1091. The second carriage 1090b is also provided with a pneumatically actuated clamp 1097 which selectively connects the second carriage 1090b to the distal section of the belt 1092. If the second carriage 1090b is connected to the distal section of the belt 1092, i.e. the clamp 1097 is attached to the distal section of the belt 1092, the second carriage 1090b travels at the same time and the same distance as the first carriage 1090a but in the opposite direction.

One of the pulleys 1093 is a driving pulley which controls the rotation of the belt 1092. The driving pulley is operatively connected to a motor 1078. Thus, rotation of the driving pulley rotates the belt 1092 and creates a simultaneous displacement of the carriages 1090a, 1090b along the transversal axis 1044. If the second one 1090b of the carriages is disconnected from the distal section of the belt 1092, both carriages 1090a, 1090b are displaced simultaneously in the same direction and by the same distance. If the second one 1090b of the carriages is connected to the distal section of the belt 1092, both carriages 1090a, 1090b are displaced simultaneously in the opposite direction and by the same distance.

Alternative mechanisms can be foreseen to the above mechanism to control the travelling path of both carriages 1090a, 1090b. For instance and without being limitative, the second carriage 1090b can be selectively physically connectable to and releasable from the first carriage 1090b; the clamp can also be designed to selectively connect the second carriage 1090b to one of the proximal section of the belt 1092 and the distal section of the belt 1092.

In the embodiment of the apparatus 1040 shown in FIGS. 27, 28, 29, and 30, two carriages 1090a, 1090b are provided. However, one skilled in the art will appreciate that the apparatus 1040 can include more or less carriages. A wire supply 1058 is associated to each one of the carriages 1090a, 1090b. Thus, two elongated wires 1016 being encapsulated between two encapsulation films are first supplied from their respective wire supplies 1058. Then, they extend longitudinally along their respective elongated arms 1094 into guiding eyelets 1062 and into the eye 1096 of their needle 1095.

As the carriages 1090a, 1090b are displaced and, more particularly, translated along the rail members 1091, the elongated wires 1016 are displaced transversally. Thus, when grasped by the two contiguous rolls 1046, the position of the elongated wire 1016 along the transversal axis 1044 is variable. Since they are simultaneously inserted between two longitudinally carried encapsulation films, the resulting encapsulated component web 1010 includes longitudinally and transversally extending wires 1016 encapsulated between two continuous encapsulation films, i.e. they extend along a wave shaped pattern.

If the second carriage 1090b is disconnected from the distal section of the belt 1092, the carriages 1090a, 1090b are displaced simultaneously in the same direction and by the same distance. Thus, the elongated wires 1016 produce the same pattern, i.e. the two patterns are substantially parallel to one another.

If the carriages 1090a, 1090b are connected to different sections of the belt 1092, the carriages 1090a, 1090b are displaced simultaneously in opposite directions and by the same distance. Thus, the elongated wires 1016 produce a symmetric pattern.

Alternative embodiments can be provided without the belt and pulley system. For instance, as mentioned above, each carriage can be provided with its own actuator for providing a translation movement along the rail members 1091 to produce irregular and asymmetric patterns. Furthermore, the apparatus can include any combination of the above-described features.

In an alternative embodiment, the apparatus can include more or less rail members; each one of the rail members slidably supporting one or more carriages. Furthermore, in an alternative embodiment, the rail members (or tracks) can be slidably mounted to one or several other rail members or tracks to provide additional degrees of freedom.

In the embodiment described above, the actuator for displacing the pulleys is a motor driving in rotation a driving pulley. Alternative embodiments can be foreseen. For instance and without being limitative, the actuator could be an hydraulic or a pneumatic cylinder operatively connected to the carriages and displacing same along the rail members. The apparatus could be free of belt and pulley assembly or the pulleys could be driven pulleys. If the pulleys are driven pulleys, the belt and pulley assembly is designed for controlling the relative displacement of the carriages.

Referring now to FIGS. 31, 32, 33, and 34, there is shown another apparatus 1140 for displacing transversally an elongated wire 1116, while it is conveyed along the production line having a longitudinal axis 1142, to obtain a longitudinally and transversally extending wire encapsulated between two continuous encapsulation films 1112. The features are numbered with reference numerals in the 1100 series which correspond to the reference numerals of the previous embodiments. In the embodiment shown in FIGS. 31, 32, 33, and 34, as the apparatus 1040, the apparatus 1140 includes two carriages 1190 slidably mounted to a track and, more particularly, a single rail member 1191, extending along the transversal axis 1119. Each one of the carriages 1190 include an elongated arm 1194 protruding forwardly and provided with a plurality of guiding eyelets 1162 to guide the elongated wire 1116 towards the contiguous rolls 1146. Each one of the elongated arms 1194 ends with two tapered nozzles 1198, each having an elongated channel 1199 defined therein through which the elongated wire 1116, conveyed along the production line, extends, as it will be described in more details below.

Thus, in the non-limitative embodiment shown in FIGS. 31, 32, 33, and 34, each elongated arm 1194 is designed to guide two elongated wires 1116 since it is provided with two tapered nozzles 1198. One skilled in the art will appreciate that the elongated arms 1194 can include more or less tapered nozzles to guide one or more elongated wire 1116.

In the embodiment shown, each one of the tapered nozzles 1198 has its own set of guiding eyelets 1162.

As the carriages 1090a, 1090b, the carriages 1190a, 1190b are also operatively connected to a belt 1192 extending around two pulleys 1193 and include complementary biasing members 1189. The first one 1190a of the carriages is connected to the proximal section of the belt 1192 and the second one 1190b of the carriages is selectively connectable to one of the first one 1190a of the carriages and the distal section of the belt 1192 through a pneumatic clamp 1197, as explained above in reference to the pneumatic clamp 1097.

As the apparatus 1040, one skilled in the art will appreciate that the apparatus 1140 can include more or less carriages 1190 and rail members 1191.

A wire supply 1158 is associated to each one of the carriages 1190a, 1190b. However, as each one of the elongated arms 1194 includes two tapered nozzles 1198, each one of the carriages 1190a, 1190b can be associated with two wire supplies 1158. The elongated wires 1116 being encapsulated between two encapsulation films 1112 extend longitudinally along their respective elongated arms 1194 into guiding eyelets 1162 and into the elongated channel 1199 of their tapered nozzle 1198.

As the carriages 1190a, 1190b are displaced and, more particularly, translate along the rail member 1191, the elongated wires 1116 are displaced transversally. Thus, when grasped by the contiguous rolls 1146, the position of the elongated wire 1116 along the transversal axis 1144 is variable. Since they are inserted between two longitudinally carried encapsulation films 1112, shortly after being released from the tapered nozzle 1198, the resulting encapsulated component web 1110 includes longitudinally and transversally extending wires 1116 encapsulated between two continuous encapsulation films 1112, i.e. the wire 1116 extends along a wave shaped pattern.

As for the apparatus 1040, if the carriage 1190b is disconnected from the proximal section of the belt 1192, the carriages 1190a, 1190b are displaced simultaneously in the same direction. Thus, the elongated wires 1116 produce the same pattern, i.e. the two patterns are substantially parallel to one another. If the carriages 1190a, 1190b are connected to different sections of the belt 1192, i.e. the second carriage 1190b is clamped on the distal section of the belt 1192, the carriages 1190a, 1190b are displaced simultaneously in opposite directions and by the same distance. Thus, the elongated wires 1116 produce a symmetric pattern.

As for the above described apparatus 1040, alternative embodiments can be provided without the belt and pulley system. For instance, each carriage can be provided with its own actuator for providing a translation movement along the rail member 1191 to produce irregular and asymmetric patterns. Furthermore, the apparatus can include any combination of the above-described features.

As mentioned above, for improved control of the elongated wire position between the encapsulation films 1112, the elongated wire 1116 is released from the last guiding member, in the present apparatus, the nozzle 1198, as close as possible to the nip 1148. Therefore, its position when it is released from the nozzle 1198, or other guiding member, is as accurate as possible to the predetermined position, i.e. the desired position, and the resulting position between the encapsulation films 1112, i.e. the position in the component web. The tapered end of the nozzle 1198 is designed to insert the elongated wire 1116 as close as possible to the nip 1148 defined between the two contiguous rolls 1146. In an embodiment, the tapered end of the nozzle 1198 has a radius of curvature which substantially corresponds to the radius of the contiguous rolls 1146 to be as close as possible to the nip 1148. The tapered end of the nozzle 1198 can be either symmetric or asymmetric.

For instance, the distance between the tip of the nozzle 1198 and the nip 1148 is smaller than about 10 millimeters and, in an alternative embodiment, smaller than about 6 millimeters.

Furthermore, to improve the accuracy, when the elongated wire 1116 is sandwiched between the two encapsulation films 1112, its displacements therebetween should be limited and minimized and, ideally, prevented downstream of the nip 1148. As mentioned above, the inner face of one or both encapsulation film(s) 1112 includes an adhesive layer. If the adhesive layer is a heat activated adhesive, the adhesive layer can be activated before entering the nip 1148. Therefore, the elongated wire 1116 inserted between the two encapsulation films 1112 is secured therebetween earlier along the production line since the adhesive sets also earlier in the continuous manufacturing process.

To activate the adhesive layer earlier in the process, the apparatus 1140 includes a heating unit 1170 mounted upstream of the nip 1148. In the embodiment shown, the heating unit 1170 is mounted to heat the inner face of the lower encapsulation film 1112. However, one skilled in the art will appreciate that the apparatus can include two or more heating units 1170 which can be mounted to heat either the upper or the lower encapsulation films 1112.

In an alternative embodiment, the contiguous rolls 1146 can be heated rolls to accelerate the cohesion between the components sandwiched together. If the apparatus includes either a heating unit 1170 mounted upstream of the nip 1148 or if at least one of the rolls 1146 defining the nip is a heated roll, the downstream lamination unit 1151 can be free of a heating component and can be designed solely to apply pressure on the superposed components and prevent displacement of the encapsulated components until the adhesive sets.

In an alternative embodiment, the contiguous rolls 1146 can be driving rolls. If the contiguous rolls 1146 are driving rolls they can be the rolls that convey the web 1110 along the apparatus 1140. In other words, the contiguous rolls 1146 pull the various web components towards it and control the speed of the production line.

Figure 35:
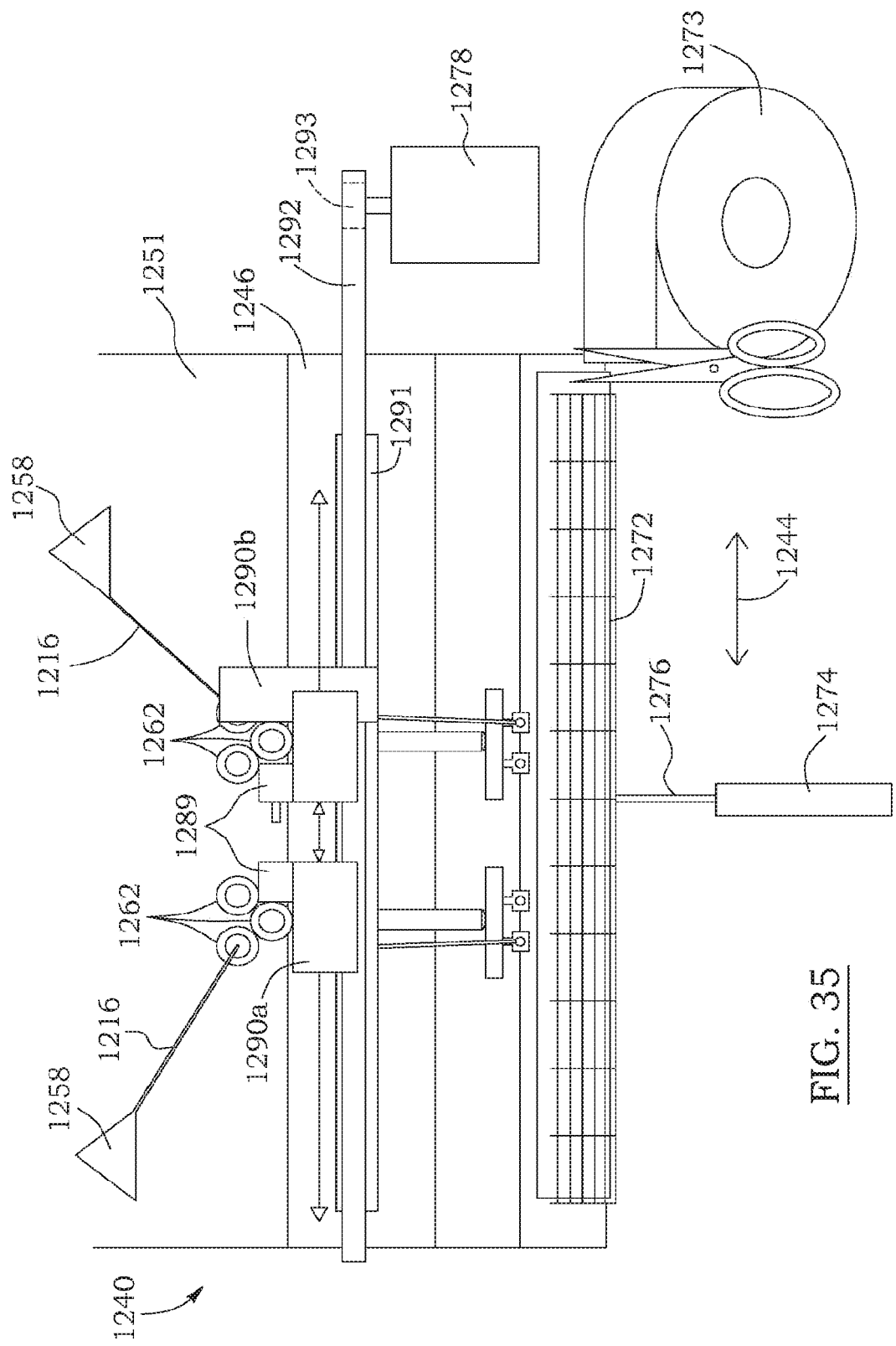
FIG. 35 is a schematic front elevation view of the apparatus shown in FIG. 31 further including a component for inserting and encapsulating transversally extending components.
Figure 36:
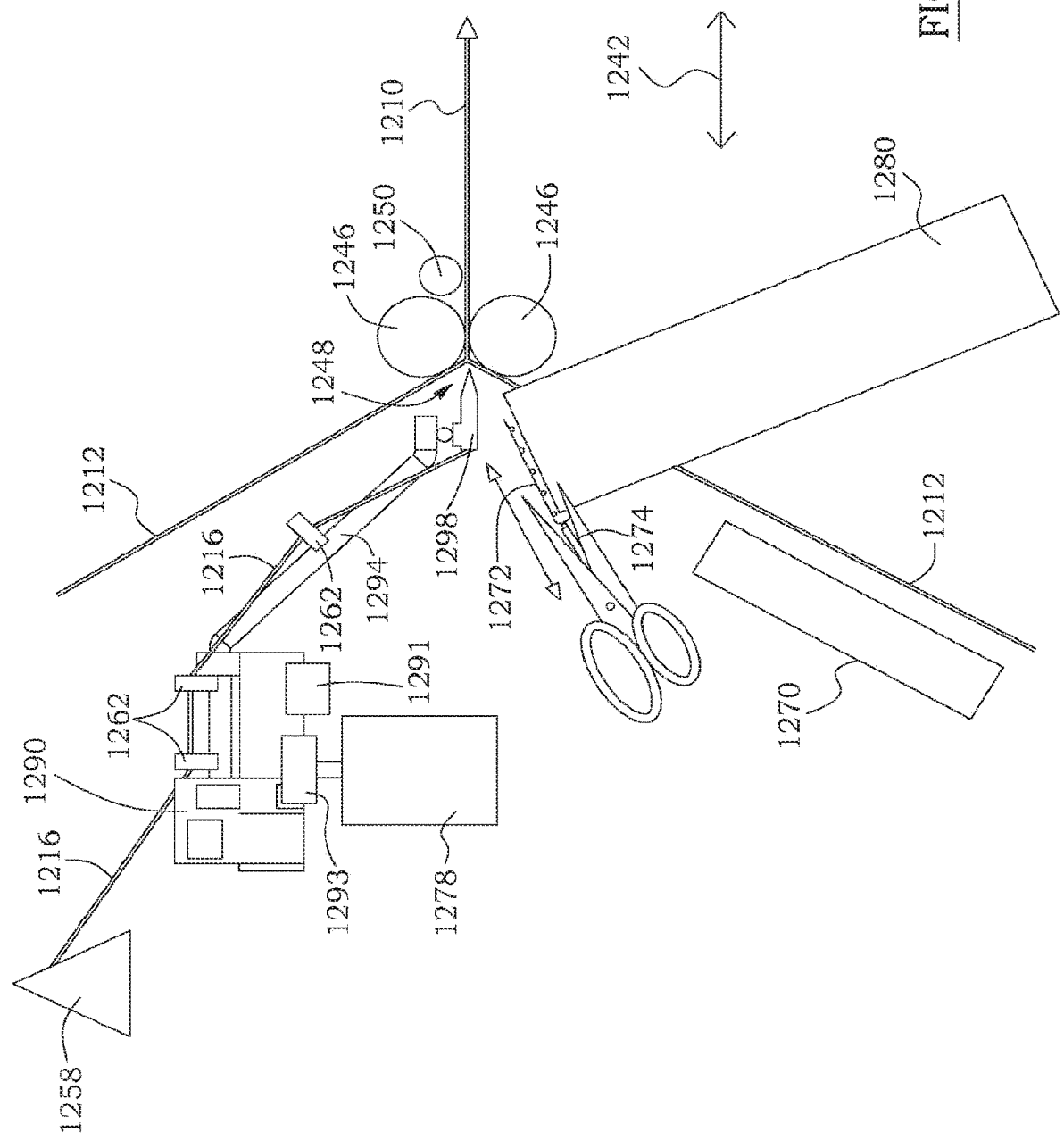
FIG. 36 is a schematic side elevation view of the apparatus shown in FIG. 35.

Referring now to FIGS. 35 and 36, there is shown an apparatus 1240, similar to apparatus 1140 described above, but including a component for inserting transversally extending strips 1280 along the transversal axis 1244 of the apparatus 1240. The features are numbered with reference numerals in the 1200 series which correspond to the reference numerals of the previous embodiments. The apparatus 1240 includes an elongated guiding member 1272, which in the embodiment shown is substantially C-shaped, mounted upstream of the nip 1248. The open end of the C-shaped elongated guiding member 1272 is oriented towards the nip 1248 in a manner such that elongated strips 1280 extending therein can be inserted between the two encapsulation films 1212, as it will be described in more details below.

The elongated guiding member 1272 extends substantially parallel to the transversal axis 1244. In the embodiment shown, the elongated guiding member 1272 is mounted below the assembly including the translatable carriages 1290, the rail member 1291, the elongated arms 1294, and the tapered nozzles 1298. Thus, the transversally extending strips 1280 are inserted below the elongated wires 1216 in the resulting encapsulated component web. However, in alternative embodiments (not shown), one skilled in the art will appreciate that the apparatus 1040 can include two or more components for inserting transversally extending strips 1280 and that the elongated guiding member(s) 1272 can be mounted above or below the assembly for inserting the longitudinally and optionally transversally extending components. Furthermore, the shape of the elongated guiding member 1272 can differ from the embodiment shown in FIGS. 35 and 36, provided that it is designed to support the transversally extending strips 1280 before their insertion in the nip 1248, as it will be described in more details below.

The apparatus 1240 further includes a strip supply 1273, as an elongated component feeder, represented as a roll in the schematic embodiment, which supplies elongated strips 1280 to the elongated guiding member 1272. The elongated strips 1280 are either cut before or after their insertion in the elongated guiding member 1272 at a predetermined length. The elongated strips 1280 can be cut with suitable cutting means such as and without being limitative rotative blades, translatable blades, laser cutting, ultrasonic cutting, water cutting etc. The elongated strips 1280 are inserted in the elongated guiding member 1272 by either an air flow or a translatable mechanical member. The elongated strips 1280 can be either pushed in the elongated guiding member 1272 or pulled therein. For pushing the elongated strips 1280 in the elongated guiding member 1272, air jets, expelled by a nozzle, can be used, for instance. To pull the elongated strips 1280 in the elongated guiding member 1272, a translatable mechanical member having a clamp can be used. For instance and without being limitative, a rapier used in the textile industry can be adapted for pulling the elongated strips 1280 in the elongated guiding member 1272.

The component for inserting transversally extending strips 1280 further includes an hydraulic cylinder 1274 with a translatable arm 1276 for pushing the elongated strip 1280, inserted in elongated guiding member 1272, towards the nip 1248 and between the encapsulation films 1212. After being pushed by the hydraulic cylinder 1274, the transversally extending strips 1280 are conveyed along the apparatus and the production line by encapsulation films 1212, which, in turn, are conveyed by the lamination unit 1251, for instance.

One skilled in the art will appreciate that the actuator, i.e. the hydraulic cylinder 124, can be replaced by any other suitable actuator designed to push the elongated strip 1280, inserted in the elongated guiding member 1272, towards the nip 1248 and between the encapsulation films 1212. Furthermore, the apparatus 1240 can include two or more actuators such as the hydraulic cylinder 1274, which cooperates to push the elongated strip inserted in the elongated guiding member 1272 towards the nip 1248.

Once again, the component for inserting transversally extending strips 1280 should be mounted close to the nip 1248.

In the embodiment shown, the transversally extending strips 1280 are inserted downstream of the membrane heating unit 1270.

One skilled in the art will appreciate that all alternative variants described in reference to the apparatuses described above are also applicable to the other apparatuses, i.e. combinations of the apparatus features are possible.

In an embodiment, the contiguous rolls at the nip include a hard core covered by a resilient material which is slightly deformed at the nip.

All the apparatuses can be operatively connected to a controller to control the displacement pattern of the elongated wire(s) and the timing of insertion of the transversally extending strips, if any. The controller, such as a programmable logic controller, controls the apparatus actuators based on a predetermined desired pattern of elongated wire(s) and transversally extending strips. It can also control the rotation speed of the rolls of the lamination unit and indirectly of the travelling speed of the encapsulation films. Alternatively, the travelling speed of the encapsulation films or the rotation speed of the rolls of the lamination unit can be measured variables and the controller adjusts the actuators associated to the insertion of the encapsulatable components accordingly.

The controller can include an algorithm to calculate the movements of the actuator based on variables such as, without being limitative, the predetermined pattern for the elongated wire(s), the speed of the encapsulating films, the distance between the last guiding member (comb, nozzle, needle, and the like) and the nip, etc.

One skilled in the art will appreciate that the above-detailed apparatuses can be used to insert other components than elongated wires between the encapsulation films.

In all of the above-detailed embodiments, discrete conductive or non-conductive (electrically inert) components, i.e. spaced apart components, can be inserted between the two encapsulation films. For instance and without being limitative, longitudinally and/or transversally spaced apart pieces of non-woven conductive fabrics can be inserted between the two encapsulation films, close to the nip defined between the two contiguous rolls.

Moreover, although the embodiments of the encapsulation apparatus and corresponding parts thereof consist of certain geometrical configurations as explained and illustrated herein, not all of these components and geometries are essential to the invention and thus should not be taken in their restrictive sense. It is to be understood, as also apparent to a person skilled in the art, that other suitable components and cooperation thereinbetween, as well as other suitable geometrical configurations, may be used for the encapsulation apparatus according to the present invention, as will be briefly explained herein and as can be easily inferred herefrom by a person skilled in the art. Moreover, it will be appreciated that positional descriptions such as "above", "below", "left", "right" and the like should, unless otherwise indicated, be taken in the context of the figures and should not be considered limiting.

Several alternative embodiments and examples have been described and illustrated herein. The embodiments of the invention described above are intended to be exemplary only. A person of ordinary skill in the art would appreciate the features of the individual embodiments, and the possible combinations and variations of the components. A person of ordinary skill in the art would further appreciate that any of the embodiments could be provided in any combination with the other embodiments disclosed herein. It is understood that the invention may be embodied in other specific forms without departing from the spirit or central characteristics thereof. The present examples and embodiments, therefore, are to be considered in all respects as illustrative and not restrictive, and the invention is not to be limited to the details given herein. Accordingly, while the specific embodiments have been illustrated and described, numerous modifications come to mind without significantly departing from the spirit of the invention. The scope of the invention is therefore intended to be limited solely by the scope of the appended claims.

The invention claimed is:

1. An encapsulated electrotextile, comprising:
at least one electrotextile strip extending longitudinally with respect to the electrotextile;
at least one elongated wire extending transversally with respect to the electrotextile; and
at least one elongated wire extending longitudinally with respect to the electrotextile,
wherein the at least one electrotextile strip and the at least one elongated wire are laminated between two encapsulation films.

2. The encapsulated electrotextile of claim 1, wherein at least one of the two encapsulation films comprises a polymeric film.

3. The encapsulated electrotextile of claim 1, wherein the at least one electrotextile strip comprises a woven textile strip with at least one electrical wire.

4. The encapsulated electrotextile of claim 1, wherein the at least one electrotextile strip comprises a non-woven fabric with a plurality of electric conductive particles.

5. The encapsulated electrotextile of claim 1, wherein at least one of the two encapsulation films comprises an adhesive layer on an inner face thereof.

6. The encapsulated electrotextile of claim 5, wherein the adhesive layer is at least one of continuous and discontinuous along the inner face.

7. The encapsulated electrotextile of claim 1, wherein at least one of the at least one elongated wire extending transversally with respect to the electrotextile or the at least one elongated wire extending longitudinally with respect to the electrotextile extends along a wave-shaped pattern.

8. The encapsulated electrotextile of claim 1, wherein at least one of the at least one elongated wire extending transversally with respect to the electrotextile or the at least one elongated wire extending longitudinally with respect to the electrotextile is an electrical conductor.

9. The encapsulated electrotextile of claim 1, wherein at least one of the two encapsulation films comprises an adhesive layer on an outer face thereof.

10. The encapsulated electrotextile of claim 1, comprising at least one paper strip coated with at least one of silicon, PTFE, and wax laminated between the two encapsulation films.

11. The encapsulated electrotextile of claim 1, wherein the at least one electrotextile strip and at least one of the at least one elongated wire extending transversally with respect to the electrotextile or the at least one elongated wire extending longitudinally with respect to the electrotextile are spaced apart from each other.

12. The encapsulated electrotextile of claim 1, wherein at least one of the two encapsulation films comprises a non-conductive support layer on an outer face thereof.

13. The encapsulated electrotextile of claim 1, wherein the at least one electrotextile strip is narrower along a transversal axis of the encapsulated electrotextile than at least one of the two encapsulation films.

14. An electrotextile, comprising:
a first encapsulation film having an adhesive layer disposed on an inner face and a non-conductive support layer disposed on an outer face;
a second encapsulation film disposed opposite the first encapsulation film;
an electrotextile strip extending in a first direction with respect to the electrotextile; and
a first elongated wire extending in a second direction with respect to the electrotextile,
wherein the electrotextile strip and the elongated wire are disposed between the first and second encapsulation films, and
wherein the first direction is different from the second direction.

15. The electrotextile of claim 14, wherein the first encapsulation film comprises a polymeric film.

16. The electrotextile of claim 14, wherein the adhesive layer comprises a heat activated or pressure sensitive adhesive.

17. The electrotextile of claim 14, wherein the non-conductive support layer is disposed directly on the outer face of the first encapsulation film.

18. The electrotextile of claim 14, wherein the non-conductive support layer comprises a textile layer.

19. The electrotextile of claim 14, wherein the non-conductive support layer comprises a polymeric layer.

20. The electrotextile of claim 14, further comprising a second elongated wire, wherein at least a portion of the first elongated wire and the second elongated wire is disposed in a symmetric pattern.

21. The electrotextile of claim 14, wherein the first direction is a longitudinal direction of the electrotextile, and wherein the second direction is a transverse direction of the electrotextile.

22. The electrotextile of claim 20, wherein the first elongated wire and the second elongated wire are parallel.

23. The electrotextile of claim 1, further comprising at least one non-conductive strip extending transversally with respect to the electrotextile.

\* \* \* \* \*

UNITED STATES PATENT AND TRADEMARK OFFICE
CERTIFICATE OF CORRECTION

PATENT NO. : 11,084,607 B2  
APPLICATION NO. : 16/241597  
DATED : August 10, 2021  
INVENTOR(S) : Gaetan Demers Page 1 of 1

It is certified that error appears in the above-identified patent and that said Letters Patent is hereby corrected as shown below:

On the Title Page

Column 1, Item (71), in "Applicant", Line 1, delete "Herzongenaurach" and insert -- Herzogenaurach --, therefor.

Column 1, Item (73), in "Assignee", Line 1, delete "Herzogenauarch" and insert -- Herzogenaurach --, therefor.

Signed and Sealed this  
Twenty-second Day of February, 2022

Drew Hirshfeld  
*Performing the Functions and Duties of the*  
*Under Secretary of Commerce for Intellectual Property and*  
*Director of the United States Patent and Trademark Office*